United States Patent [19]
Mori

[11] Patent Number: 5,299,160
[45] Date of Patent: Mar. 29, 1994

[54] SEMICONDUCTOR MEMORY DEVICE CAPABLE OF REPAIRING DEFECTIVE BITS

[75] Inventor: Shigeru Mori, Hyogo, Japan

[73] Assignee: Mitsubishi Denki Kabushiki Kaisha, Tokyo, Japan

[21] Appl. No.: 45,149

[22] Filed: Apr. 12, 1993

[30] Foreign Application Priority Data

Jun. 2, 1992 [JP] Japan .................................. 4-141146

[51] Int. Cl.$^5$ ........................................... G11C 13/00
[52] U.S. Cl. ..................... 365/200; 365/96; 365/201; 365/230.03
[58] Field of Search ............ 365/96, 200, 201, 189.01, 365/230.01, 189.03, 189.05, 189.08, 230.03

[56] References Cited

PUBLICATIONS

A. Ohta et al., "A 7-ns 1-Mo BiCMOS ECL SRAM with Shift Redundancy", IEEE Journal of Solid-State Circuits, vol. 26, No. 4, Apr. 1991.

*Primary Examiner*—Terrell W. Fears
*Attorney, Agent, or Firm*—Lowe, Price, LeBlanc & Becker

[57] ABSTRACT

An input/output switching circuit is provided between I/O blocks and I/O pads. The input/output switching circuit includes fusable elements connected in series, and a switching elements for defining connection path of I/O blocks and I/O pads in response to a potential of each one end of the fusable elements. The switching element connects an I/O block to an I/O pad in a one-to-one correspondence when all the fusable elements are conductive. When one fusable element is disconnected, the switching element isolates a corresponding defective I/O block from an I/O pad, and switches the connection path of each I/O block towards the pad corresponding to the defective I/O block. In a semiconductor memory device having an error checking bit, the manufacturing yield of a semiconductor memory device can be improved by isolating a defective I/O block that cannot be repaired by a normal redundant circuit scheme, and operating the same as a semiconductor memory device without an error checking bit.

27 Claims, 16 Drawing Sheets

FIG. 16 PROIR ART

SEMICONDUCTOR MEMORY DEVICE CAPABLE OF REPAIRING DEFECTIVE BITS

BACKGROUND OF THE INVENTION

1. Field of the Invention

The present invention relates to semiconductor memory devices, and more particularly to a semiconductor memory device having an error check bit memory region. More specifically, the invention relates to a structure for repairing a defective bit of a semiconductor memory device.

2. Description of the Background Art

In semiconductor memory devices that can carry out data input/output in the unit of a plurality of bits, there are some that can carry out input/output of data together with an error checking bit. An error checking bit is used for detecting whether there is an error in data bits forming the data. Parity check is one method of checking an error.

According to a parity check method, the value of a parity bit of 1 bit is defined as "1" or "0" according to whether the number of ones in the data bits forming the data is an even number or an odd number, and the parity bit is added to the data bits. The data arrangement of data bits and a parity bit is defined so that the number of ones is constantly an even number or an odd number. The data bits and a parity bit are received at the time of data transfer in a data communication system, for example, to detect the number of ones included in the data arrangement, whereby an error of 1 bit in the data bits that are being transferred is detected.

FIG. 16 shows a structure of a memory array of a conventional semiconductor memory device. In FIG. 16, an example of a structure of a dynamic random access memory that can input and output 9 bits of information I/O0 to I/O8 at a time is illustrated. This dynamic random access memory has a x9 organization where a parity bit of 1 bit is added to a x8 organization.

Referring to FIG. 16, a semiconductor memory device 100 includes pads 6a, 6b, 6c, 6d, 6e, 6f, 6g, 6h and 6i for receiving in parallel 9 bits of information I/O0-I/O8, and memory cell array blocks 3a, 3b, 3c, 3d, 3e, 3f, 3g, 3h and 3i provided corresponding to pads 6a-6i. In the following description, the 8 bits of I/O0 to I/O7 are referred to as data bits, and I/O8 is referred to as the parity bit.

Spare rows of 4a-4i and spare columns of 5a-5i for repairing a defective bit are provided for each of memory cell array blocks of 3a-3i, respectively.

Row decoders 1a-1i are provided for memory cell blocks 3a-3i, respectively, for decoding a supplied address signal to select one row (word line) in a corresponding memory cell array block. A column decoder 2a is provided for memory cell blocks 3a-3d for selecting 1 column from each memory cell array block according to a supplied column address signal. A column decoder 2b is provided to memory cell array blocks 3e-3i for decoding a supplied column address signal to select a column from each of memory cell array blocks 3e-3i.

Row decoders 1a-1i respectively include a spare row decoder, and column decoders 2a and 2b respectively include a spare column decoder. When a supplied address designates a defective row (or column), a spare row (column) decoder inhibits the selection of that defective row (or column) and carries out the selection of 1 row (or 1 column) in the spare rows (or columns).

In the following description, the row decoder for selecting a spare row 4 (indicating spare rows 4a-4i generally) is called the spare row decoder, and the decoder for selecting a spare column 5 (indicating spare columns 5a-5i generally) is called the spare column decoder, and the decoders for selecting rows and columns in a memory cell array block 3 (indicating blocks 3a-3i generally) are called the normal row decoder and the normal column decoder.

Memory cell array blocks 3a-3d are connected to pads 6a-6d, respectively, via a data bus 40a. Memory cell array blocks 3e-ei are connected to pads 6e-6i, respectively, via a data bus 40b. Although not shown, an input/output circuit for carrying out buffering of input and output signals are provided respectively for memory cell array blocks 3a-3i. Data buses 40a and 40b are provided between pads 6a-6i and the input/output circuit carrying out such a buffering process. Array blocks 3a-3i and pads 6a-6i have a one-to-one correspondence.

A spare row and a spare column are provided respectively for memory cell array blocks 3a-3i. There may exist a memory cell that does not operate properly in a certain memory cell array block 3 on account of admixture of particles during the manufacturing process of the device or defect in the silicon substrate itself. A row or column including the defective memory cell that does not operate properly is replaced by spare row 4 or spare column 5. By replacing the defective memory cell with a spare memory cell, the defective memory cell in the memory cell array block can be repaired. Thus, the required number of memory cells that properly operate can be ensured in a memory cell array block even if there is a defective memory cell in a certain memory cell array block.

A conventional semiconductor memory device has a spare row 4 and a spare column 5 provided in respective I/O blocks. In the following description, an I/O block is assumed to indicate a circuit block associated with 1 bit. An I/O block includes a memory cell array block, a spare row, a spare column, a row decoder, and an input/output buffer circuit (not shown in FIG. 16).

Replacement of a defective memory cell is carried out independently in each I/O block. For example, a defective memory cell in memory cell array block 3a can be substituted by only spare row 4a or spare column 5a. If defective memory cells are intensive in a certain I/O block, they may not be completely substituted with the spare row 4 and the spare column 5 provided in that I/O block. A semiconductor memory device including such a defective I/O block has been treated as a condemned product since it cannot properly operate as a semiconductor memory device of x9 configuration. This generates a problem that the production yield cannot be improved.

If there is a defective I/O block in a semiconductor memory device of x9 organization, a possible consideration is to use that semiconductor memory device as a x8 organization device without using that defective I/O block. However, the position of the defective I/O block cannot be predicted. The connection between an I/O block and a pad for signal input/output is determined uniquely. Therefore, when using that semiconductor memory device as one of a x8 organization, the position of the unusable pad cannot be predicted.

As shown in FIG. 17, a package 600 accommodating semiconductor memory device 100 is provided with external terminals 60a–60i. Pads 6a–6i of semiconductor memory device 100 are connected to external terminals 60a–60i via bonding wires.

The connection between pads 6a–6i and external terminals 60a–60i is determined uniquely and fixedly. The position/arrangement of data input/output terminals 60a–60i of external terminals is defined in one-to-one correspondence in the specification. If there is defective input/output block in a semiconductor memory device of a conventional structure, it cannot be re-used as a semiconductor memory device of x8 organization. This is because the position of the usable data input/output terminals differ from product to product.

SUMMARY OF THE INVENTION

An object of the present invention is to provide a semiconductor memory device that can be used as another type device even if a defective input/output block exists.

Another object of the present invention is to provide a semiconductor memory device with an error checking bit that can be used as a semiconductor memory device without an error checking bit if a defective input/output block exists.

A further object of the present invention is to provide a semiconductor memory device that can improve the product yield.

In the present invention, connection circuitry is provided between a bit input/output (IO) pad and an I/O block. The connection between an input/output block and an I/O pad is modified by this connection circuitry when there is a defective input I/O block. The defective I/O block is separated from the bit input or output pad.

The connection circuitry connects normal I/O blocks to fixedly determined I/O pads.

According to the present invention, only normal I/O blocks are connected to position-fixed I/O pads when there is a defective I/O block, so that a defective semiconductor memory device can be reproduced as an acceptable product. For example, a semiconductor memory device with an error checking bit can be made available as a semiconductor memory device without an error checking bit.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

Figure 1:
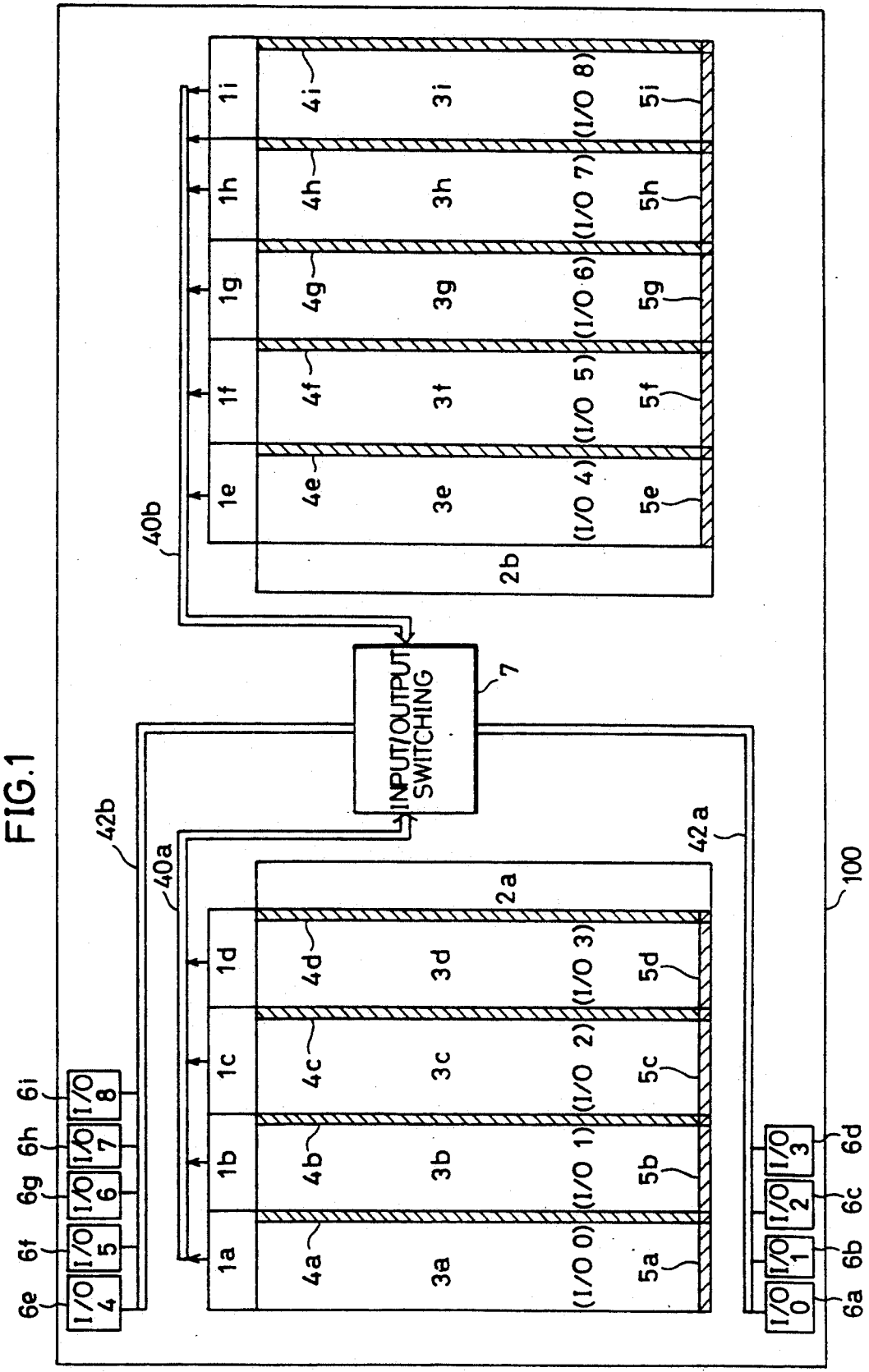
FIG. 1 schematically shows an entire structure of a semiconductor memory device according to an embodiment of the present invention.

FIG. 1 shows an arrangement of a memory cell array of a semiconductor memory device according to a first embodiment of the present invention. Referring to FIG. 1, a semiconductor memory device 100 includes pads 6a, 6b, 6c, 6d, 6e, f, 6g, 6h and 6i disposed along the outer periphery of a chip. Pads 6a–6d are disposed along one side of the chip, and pads 6e–6i are disposed at the other side of the chip. Pads 6a–6i are supplied with information bits of I/O0, I/O2, I/O3, I/O4, I/O5, I/O6, I/O7 and I/O8. In the following description, it is assumed that information bit I/O8 applied to pad 6i is a bit for error checking, i.e. a parity bit, and the remaining information bits I/O0–I/O7 applied to pads 6a–6h are data bits.

The memory cell array includes memory cell array blocks 3a, 3b, 3c, 3d, 3e, 3f, 3g, 3h and 3i divided corresponding to pads 6a–6i. Spare rows 4a and 4i and spare columns 5a–5i are disposed for memory cell array blocks 3a–3i, respectively. Spare row 4 (indicating spare rows 4a–4i generally) and spare column 5 (indicating spare columns 5a–5i generally) can be substituted with a memory cell of a corresponding memory cell array block 3 (indicating memory cell array blocks 3a–3i generally). In other words, a defective memory cell in one memory cell array block 3 can be repaired by the corresponding spare row 4 or spare column 5.

Row decoders 1a–1i are provided for memory cell array blocks 3a–3i. Row decoders 1a–1i also comprise a spare row decoder for selecting spare rows 4a–4i. A column decoder 2a is provided for memory cell array blocks 3a–3d and a column decoder 2b is provided for memory cell array blocks 3e–3i. Column decoders 2a and 2b includes a spare column decoder for selecting spare columns 5a–5d and 5e–5i, respectively. In FIG. 1, column decoders 2a and 2b are shown to select a spare column of the same column address in respective spare columns 5a-5d and 5e-5i. This may have a structure where selection of a spare columns is carried out independently in each of spare columns 5a-4d and 5e-5i.

Semiconductor memory device 100 further includes an input/output switching circuit 7 for controlling connection between pads 6a-6i and I/O blocks. An I/O block corresponding to an I/O bit of 1 bit includes a row decoder 1 (indicating row decoders 1a-1i generally), memory cell array block 3, a spare row 4, a spare column 5, and an input circuit and an output circuit for carrying out reading and writing of information with the memory cell array block. In the following description, the input and output portion of an I/O block indicates an input/output control unit provided for each block.

The I/O blocks corresponding to information bits I/O0-I/O3 are connected to input/output switching circuit 7 via a data bus 40a, and the I/O blocks corresponding to information bits I/O4-I/O8 are connected to input/output switching circuit 7 via a data bus 40b. Input/output switching circuit 7 is connected to pads 6a-6d via a data bus 42a, and to pads 6e-6i via a data bus 42b.

When all of defective memory cells in memory cell array block 3 are repaired by a corresponding spare row 4 or a spare column 5 in semiconductor memory device 100, this semiconductor memory device 100 operates as a semiconductor memory device of x9 organization. Under this state, input/output switching circuit 7 connects I/O blocks to respective corresponding pads 6a-6i.

If there are more defective memory cells than can be repaired with spare row 4 or spare column 5 in one memory cell array block 3, that I/O block which is isolated from the corresponding pad. This isolation operation is carried out by input/output switching circuit 7. In addition to this separation, input/output switching circuit 7 shifts the connecting pad of an I/O block towards the defective I/O block. For example, if information bit I/O2 corresponds to a defective I/O block, input/output switching circuit 7 isolates the I/O block corresponding to this information bit I/O2. Input/output switching circuit 7 shifts the pads for the input/output (I/O) blocks corresponding to information bits I/O3-I/O8 towards the pad corresponding to the defective I/O block by one pad. Therefore, in this case, I/O blocks corresponding to information bits I/O3-I/O8 are connected to pads 6c-6h, respectively. No I/O block is connected to parity bit pad 6i. Under this state, semiconductor memory device 100 operates as a semiconductor device of a x8 organization without a parity bit.

According to this connection switching arrangement, normal I/O blocks are always connected to pads 6a-6h corresponding to information bits I/O0-IO7 when one defective I/O block exists. The position of pads that can be used is always defined uniquely. Thus, a semiconductor memory device of a x9 organization can be used as a semiconductor memory device of a x8 organization when there is a defective I/O block, so that the manufacturing yield can be improved. The structure of the input/output switching circuit will be described hereinafter.

Figure 2:
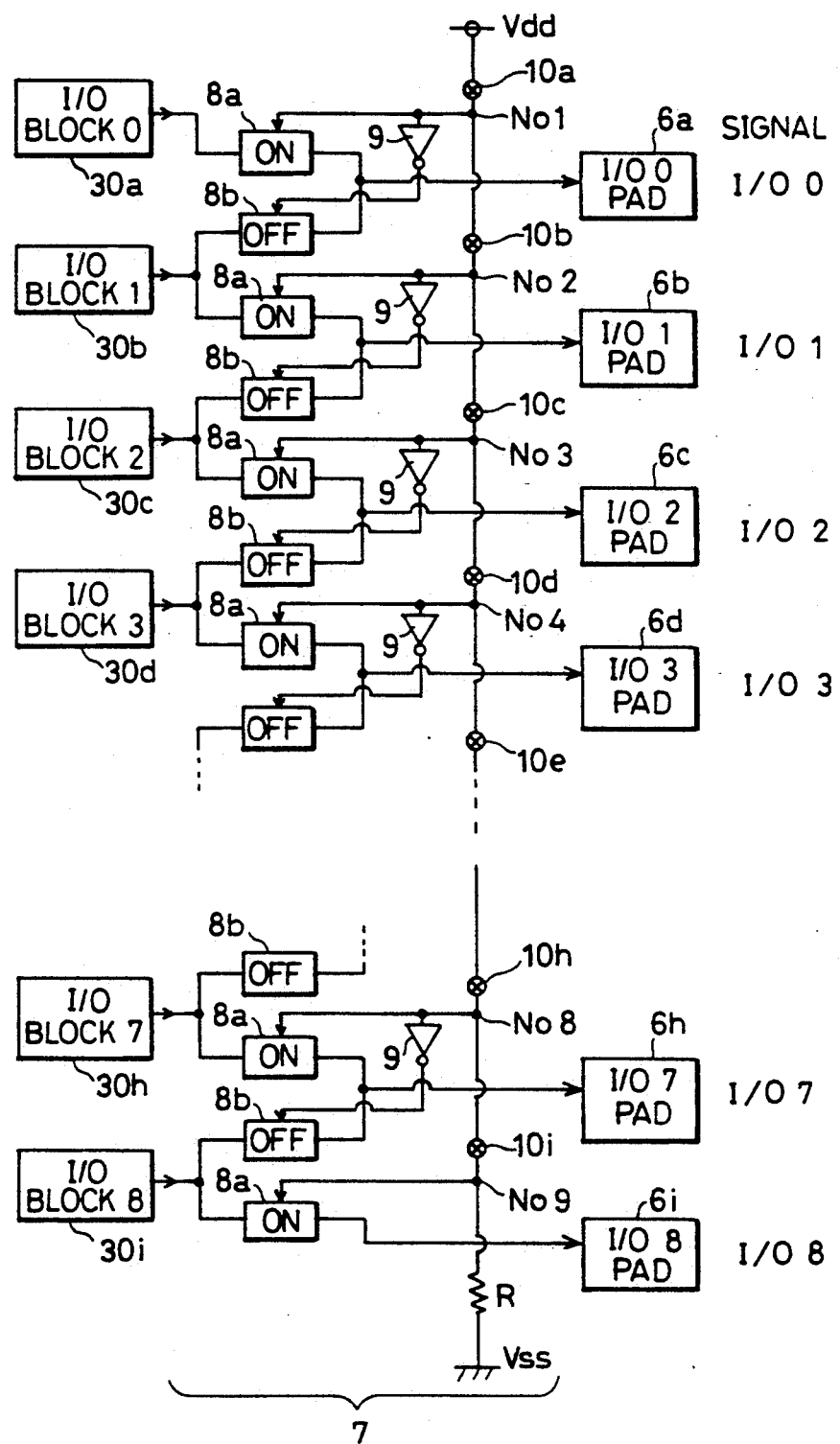
FIG. 2 specifically shows a structure of an input/output switching circuit shown in FIG. 1.

FIG. 2 specifically shows a structure of the input/output switching circuit of FIG. 1. Referring to FIG. 2, input/output switching circuit 7 includes fusable elements 10a-10i connected in series between power supply potential Vdd and ground potential Vss. Fusable elements 10a-10i correspond to I/O blocks 30a-30i, respectively. Fusable element 10a is connected to power supply potential Vdd, and fusable element 10i is connected to ground potential Vss via a resistive element R having a sufficiently large resistance value.

Input/output switching circuit 7 further includes first switching elements 8a for connecting I/O blocks 30a-30i to corresponding pads 6a-6i, and second switching elements 8b for switching the connection pads of I/O blocks 30b-30i to pads adjacent by one in bit sequence. The second switching element is not provided for I/O block 30a corresponding to information bit I/O0. The potential of one end (nodes NO1-NO9) of a corresponding fusable element is transmitted to first switching element 8a. The potential of the other end of the corresponding fusable element is transmitted to second switching element 8b via an inverter circuit 9.

First and second switching elements have the same structure, and are conductive when a signal of "H" (logical high) is applied to the control input. First and second switching elements 8a and 8b are provided for I/O blocks 30a-30i excluding I/O block 30a corresponding to the first bit. Thus, I/O blocks 30b-30i can be connected alternatively to two pads. First and second switching elements 8a and 8b are turned off and on complementarily. The connection path between an I/O block and an IO pad can be determined by the conduction/non-conduction of a corresponding fusable element 10 (indicating fuses 10a-10i generally). The operation thereof will be described hereinafter.

If all I/O blocks 30a-30i operate properly, fusable elements 10a-10i are all made conductive. A series body of fusable elements 10a-10i is connected to ground potential Vss via a resistive element R having a large resistance value. Therefore, the potential level of one end of fusable elements 10a-10i i.e. of nodes NO1-NO9 attain a H level of power supply voltage Vdd. The potential of nodes NO1-NO9 is supplied to the control input of each first switching element 8a, and the potential of nodes NO1-NO8 is supplied to the control input of each second switching element 8b via inverter circuit 9. Switching elements 8a and 8b attain a conductive state when signals of "H" are applied to their control inputs. Therefore, the first switching element 8a becomes conductive, and second switching element 8b becomes non-conductive. I/O blocks 30a-30i are connected to pads 6a-6i, respectively, via an associated first switching element 8a. Information bits I/O0-I/O8 are supplied in parallel to pads 6a-6i, respectively. More specifically, I/O blocks 30a-30i are connected to pads 6a-6i in a one-to-one correspondence, and transfer of information bits is carried out. The semiconductor memory device operates as a device of a x9 organization in this state.

An operation will be described hereinafter in the case where there are more defective memory cells in one memory cell array block than those that can be repaired by a spare row and column.

Figure 3:
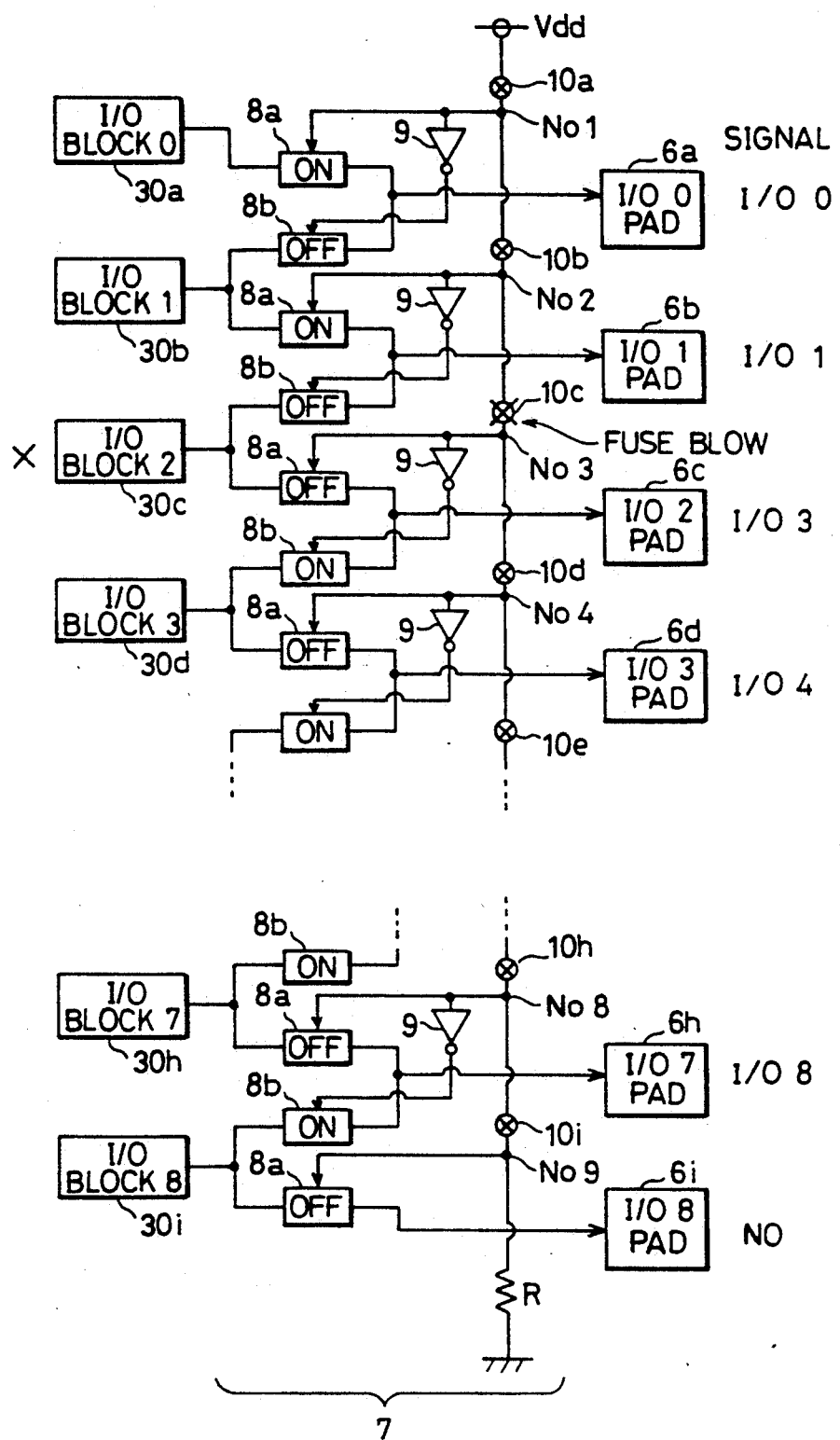
FIG. 3 shows the state of the input/output switching circuit of FIG. 2 at the time of isolating a defective I/O block.

FIG. 3 shows a structure of an input/output switching circuit in the case where I/O block 30c is a defective I/O block having defective memory cells that cannot be repaired. When I/O block 30c corresponding to information bit I/O2 is a defective I/O block, the corresponding fusable element 10c is disconnected or open-circuited (fuse blow). Since nodes NO1 and NO2 are connected to power supply voltage Vdd, each potential level thereof is "H". The potential of nodes NO3-NO9 between fusable element 10c and ground potential Vss all attain a "L" level. Therefore, each first switching element 8a of blocks 30c-30i corresponding to information bits I/O2-I/O8 is turned off. Second switching element 8b of the defective I/O block 30c receives the potential of node NO2 at its control input via inverter circuit 9 to be turned off. Thus, defective I/O block 30c is isolated from all pads.

For I/O blocks 30d-30i corresponding to information bits I/O3-I/O8, all second switching elements 8b are conductive. Therefore, I/O blocks 30d-30i are connected to pads 6c-6h via second switching elements 8b. In other words, I/O blocks 30d-30i are connected to pads adjacent by one to original pads. No I/O block is connected to parity bit pad 6i. Therefore, transmission of information is carried out between all the I/O blocks excluding I/O block 30c and pads 6a-6h.

I/O blocks that operate properly are connected to pads 6a-6h regardless of which I/O block is the defective I/O block. Therefore, when the device is to be used in x8 organization, wiring is carried out between pads 6a-6h and external lead terminals. Because the position of the data input/output terminals is fixed, the device can be operated in x8 organization.

Thus, a device that cannot be used as a x9 organization device can be re-used as a device of a x8 organization by open-circuiting a fusable element corresponding to an existing defective I/O block and changing the connection path between the I/O blocks and pads.

Embodiment 2

In the first embodiment, a particular I/O block is entirely isolated from the I/O pad by blowing off a fusable element in input/output switching circuit 7. In general, one I/O block is divided into a plurality of sub-blocks. In operation, only a particular sub-block including a selected word line is selected to attain an active state in each I/O block. This is to reduce decrease the charging/discharging current that flows at the time of sensing operation and bit line precharging.

Figure 4:
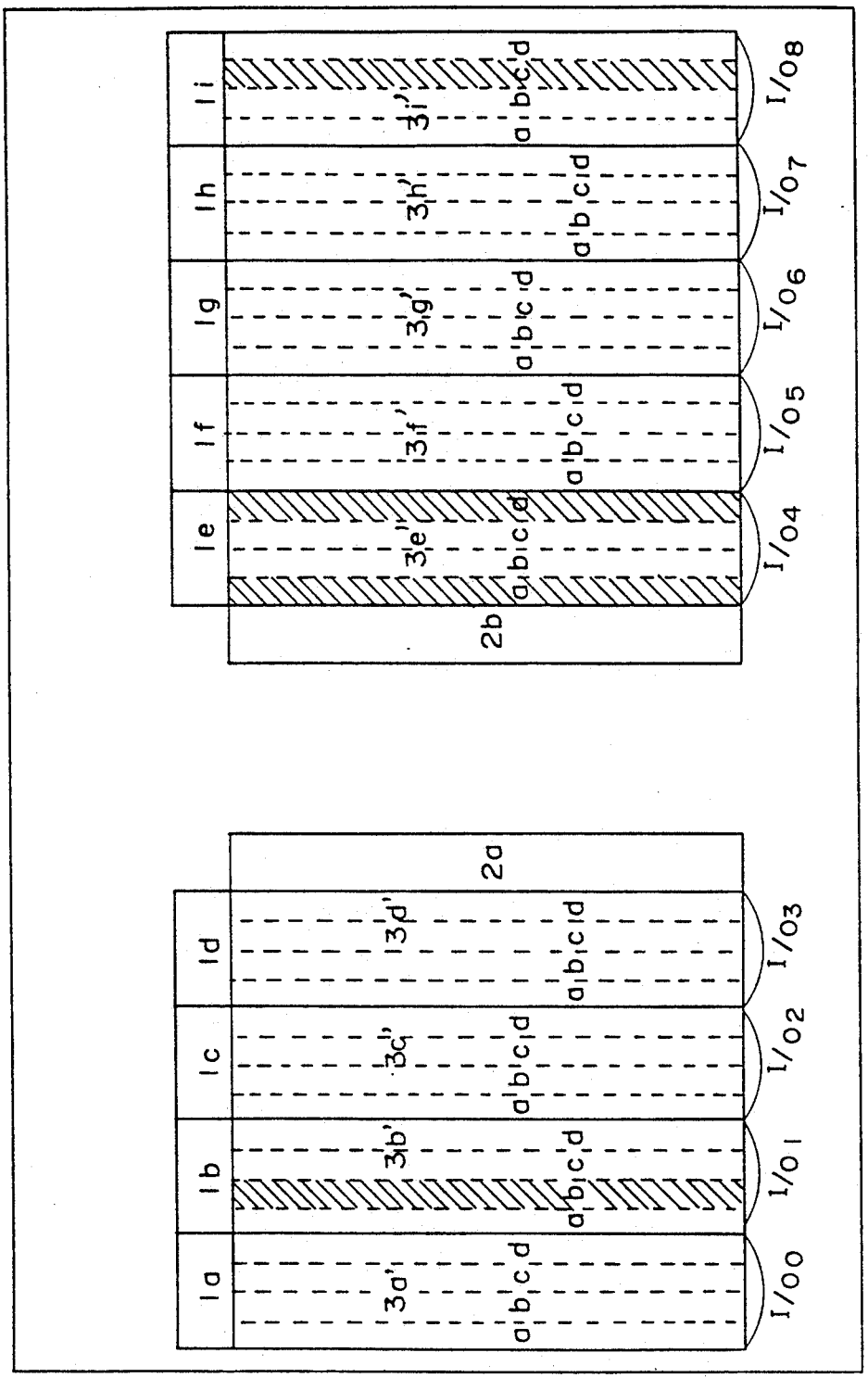
FIG. 4 shows an arrangement of a semiconductor memory device of a partial activation method.

FIG. 4 shows an array of a semiconductor memory device of a partial activation arrangement. Referring to FIG. 4, each of array blocks 3a'-3i' include four sub-blocks a, b, c and d. Sub-blocks a, b, c and d include a spare row and a spare column (not shown in the drawing). The substitution of a defective memory cell is carried out independently in respective sub-blocks a, b, c and d. A defective memory cell in one sub-block cannot be substituted with a spare row or a spare column of another sub-block. In operation, row decoders 1a-1i each select one row (word line). Sub-blocks not including the selected row attain an inactive (precharge) state. Only the sub-block including the selected row attains an active state. This selection/non-selection of a sub-block is carried out by a block decoder (not shown clearly).

In practice, it is unlikely that defective memory cells occur intensively in one I/O block. There is a possibility of more defective memory cells than can be repaired in one sub-block over a plurality of I/O blocks. If the cause of a defective memory cell is a particle, defective memory cells will be seen locally and intensively if this particle is great in size. If the particle is small, defective memory cells caused by small particles are distributed over plural I/O blocks. The possibility of a large particle being introduced is low.

Referring to FIG. 4, consider a case where there are more defective memory cells than can be repaired by a spare row or column in sub-block b in block 3b' corresponding to information bit I/O1, sub-blocks a and d in block 3e' corresponding to information bit I/O4, and in sub-block c in block 3i' corresponding to information bit I/O8. In this case, blocks 3b', 3e', and 3i' are defective I/O blocks. If the connection between an I/O block and an I/O pad can be controlled independently in the unit of sub-blocks, the repairing rate can further be improved to raise the yield because more devices of a x9 organization can be used as a device of a x8 organization.

Figure 5:
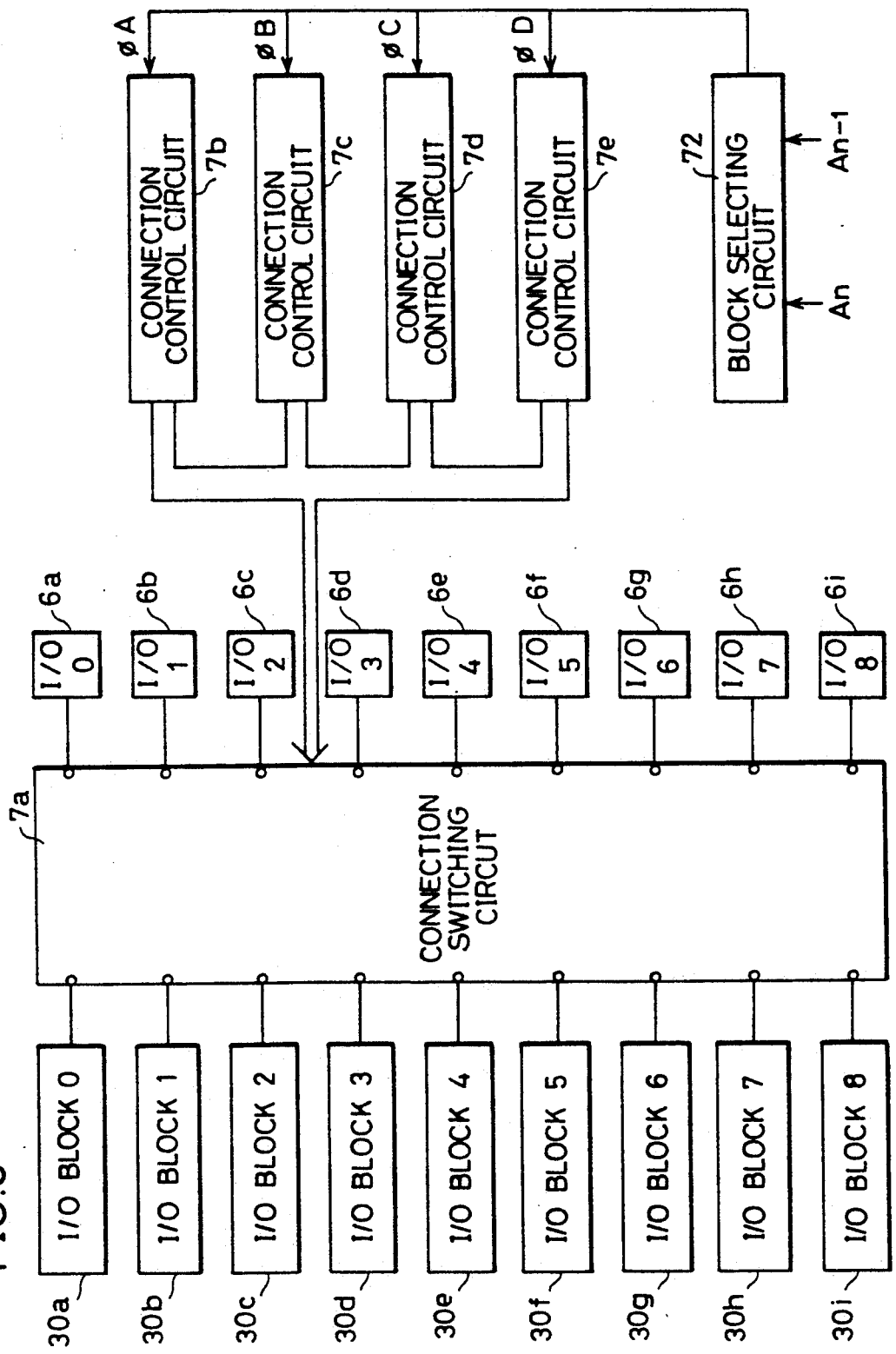
FIG. 5 schematically shows a structure of a semiconductor memory device according to a second embodiment of the present invention.

FIG. 5 schematically shows a structure of a semiconductor memory device according to a second embodiment of the present invention. Referring to FIG. 5, input/output switching circuit 7 includes connection switching circuit 7a provided between the signal input/output portions of I/O blocks 30a-30i and I/O pads 6a-6i, and connection control circuits 7b, 7c, 7d and 7e for determining the connection path of connection switch circuit 7a for each selected sub-block. Connection control circuits 7b-7e are activated in response to sub-block designating signals φA, φB, φC and φD respectively from a block selecting circuit 72 to generate a connection control signal determined for every sub-block. Connection switching circuit 7a responds to a connection control signal provided from any of connection control circuits 7b-7e to establish connection between I/O blocks 30a-30 and I/O pads 6a-6i. Block selecting circuit 72 decodes, for example, the most significant 2 bits of address signal bits (when there are 4 sub-blocks) An and An-1 of a row address signal to generate a sub-block designating signal φA-φD specifying any of the four sub-blocks a, b, c and d.

According to the structure of FIG. 5, connection between I/O blocks 30a-30i and I/O pads 6a-6i is determined according to a selected sub-block. Therefore, even a plurality of defective I/O blocks can be repaired as long as the indications of defective sub-blocks differ from each other, resulting in improvement of the yield.

Figure 6:
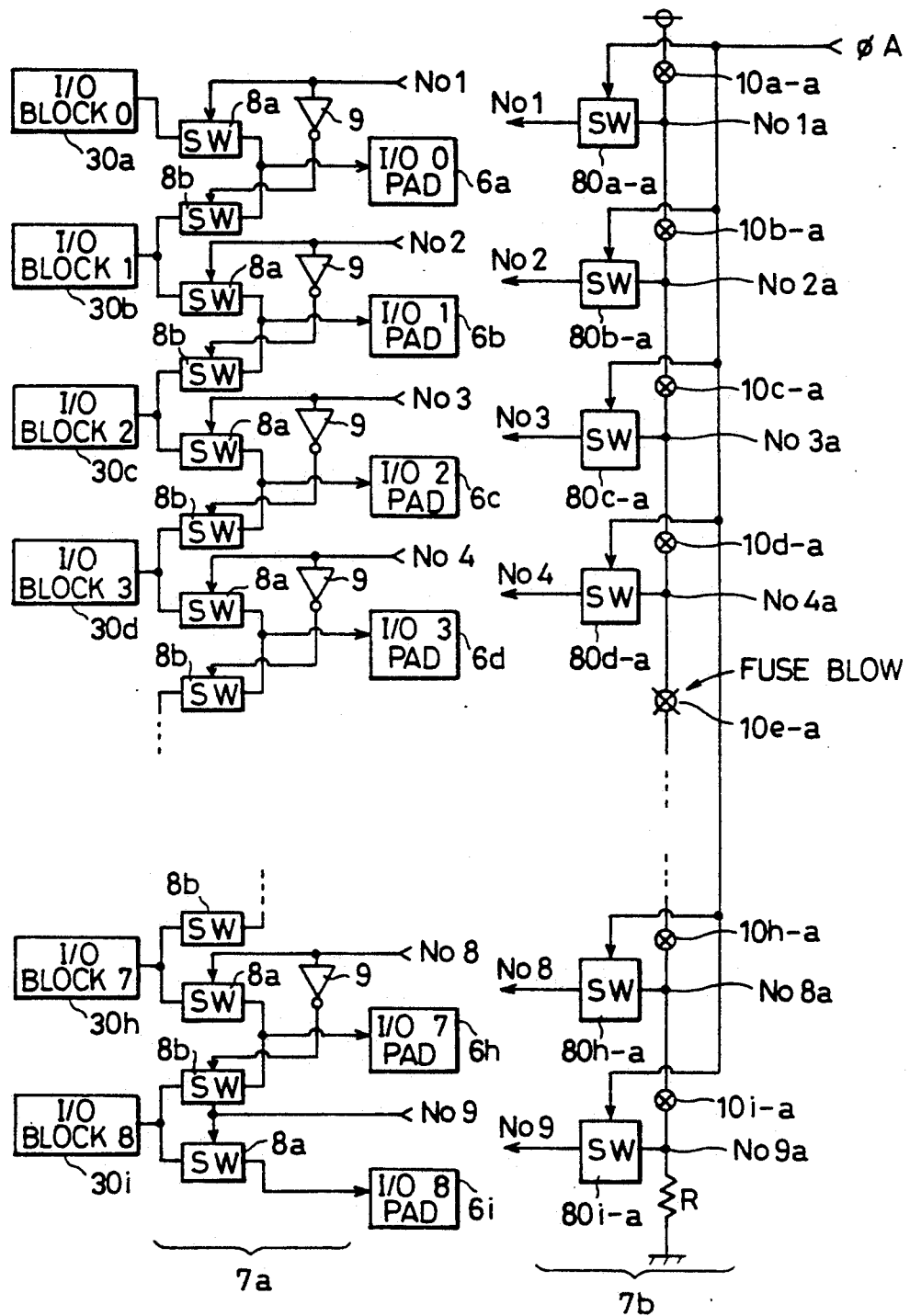
FIG. 6 shows a structure and operation state of the connection switching circuit and connection control circuit of FIG. 5.
Figure 7:
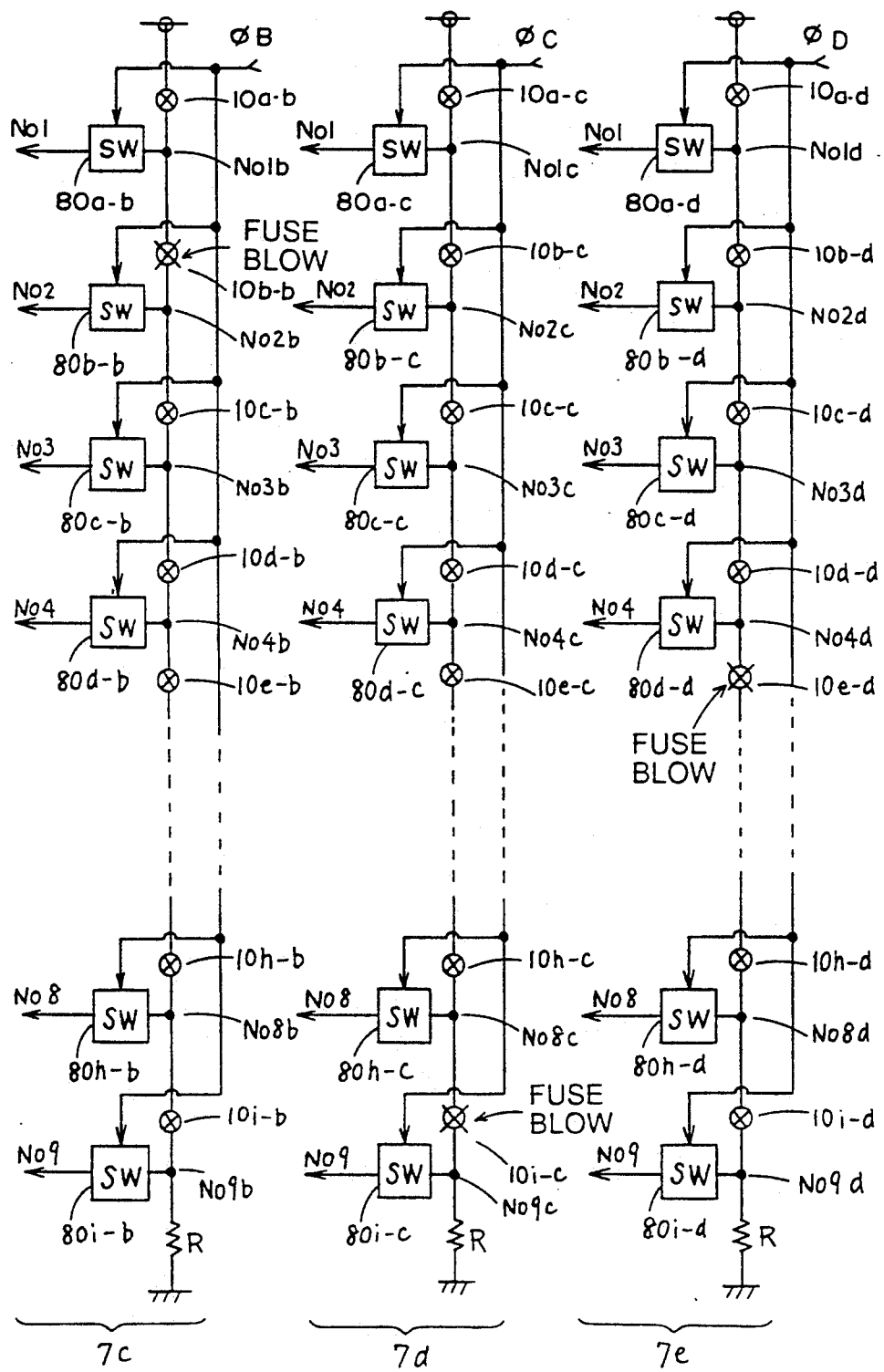
FIG. 7 is a diagram for describing the structure and operation of the connection control circuit of FIG. 5.

FIGS. 6 and 7 specifically show the structure of the connection switching circuit and the connection control circuit shown in FIG. 5. FIG. 6 shows a connection switching circuit and a connection control circuit for sub-block a, and FIG. 7 shows a connection control circuit for sub-blocks b, c and d.

Referring to FIG. 6, connection switching circuit 7a includes first switching elements 8a provided for I/O blocks 30a-30i, and second switching elements 8b provided for I/O blocks 30b-30i. First switching element 8a connects a corresponding I/O block to a originally corresponding I/O pad. Second switching element 8b connects a corresponding I/O block to an I/O pad adjacent by one in a bit order. The potential of nodes NO1-NO9 is transmitted to the control inputs of first switching elements 8a. The potential of nodes NO1--NO8 is applied to control inputs via inverter circuits 9 to second switching elements 8b. A second switching element is not provided for I/O block 30a corresponding to the first information bit I/O0.

Connection control circuit 7b for sub-block a includes fusable elements 10a-a to 10i-a connected in series between power supply potential Vdd and ground potential Vss. Fusable element 10a-a is connected to power supply potential Vdd, and fusable element 10i-a is connected to ground potential Vss via a resistive element R having a sufficiently large resistance value. Switching elements 80a-a to 80i-a conducting in response to a sub-block designating signal φA are provided for one terminal of fusable elements 10a-a to 10i-a, i.e. nodes NO1-NO9a. When switching elements 80a-a to 80i-a are conductive, nodes NO1-NO9 of connection switching circuit 7a are connected to nodes NO1a-NO9a of connection control circuit 7b.

Connection control circuit 7c for sub-block b includes fusable elements 10a-b to 10i-b connected in series between power supply potential Vdd and ground potential Vss, a resistive element R, and switching elements 80a-b to 80i-b conducting in response to a sub-block designating signal $\phi$B for connecting one terminal of fusable elements 10a-b to 10i-b, i.e. nodes NO1b-NO9b to nodes NO1-NO9 of the connection switching circuit.

Connection control circuit 7d for sub-block c includes fusable elements 10a-c to 10i-c connected in series between power supply potential Vdd and ground potential Vss, resistive element R, and switching elements 80a-c to 80i-c responsive to a sub-block designating signal $\phi$C for connecting one node NO1c-NO9c of fusable elements 10a-c to 10i-c to nodes NO1-NO9.

Connection control circuit 7e for sub-block d included fusible elements 10a-d to 10i-d connected in series between power supply potential Vdd and ground potential Vss, resistive element R having a sufficient great resistance, and switching elements 80a-d to 80i-de responsive to a sub-block designating signal $\phi$D for connecting node NO1d-NO9d of fusible elements 10a-d to 10i-d and nodes NO1-NO9.

As shown in FIGS. 6 and 7, each connection control circuits 7b-7e include a series body of fuses and have the same structure. Each fusible element corresponds to an I/O block. For each sub-block, a fusible element corresponding to the I/O block to be isolated is disconnected. FIGS. 6 and 7 show the state of fusible elements for repairing the defective sub-blocks shown in FIG. 4, where I/O block 30e (corresponding to I/O4) is isolated with respect to sub-block a, I/O block 30b corresponding to bit I/O1 is isolated with respect to sub-block b, I/O block 30i corresponding to bit I/O8 is isolated with respect to sub-block c, and I/O block 30e corresponding to bit I/O4 is isolated with respect to sub-block d. A fusible element corresponding to a defective I/O block is disconnected for each sub-block. One of sub-block designating signals $\phi$A-$\phi$D attains an active state. Therefore, a connection control signal of the connection control circuit corresponding to a selected sub-block is applied to the control inputs of switching elements 8a and 8b of connection switching circuit 7a. This determines the connection between I/O blocks and I/O pads for each selected sub-block. The operation thereof will be described hereinafter briefly.

When sub-block a is selected and attains an active state, only sub-block designating signal $\phi$A is brought to "H" and signals $\phi$B-$\phi$D are brought to "L". Switching elements 80a-a to 80i-a in connection control circuit 7b become conductive, and the potential of nodes NO1a-NO9a is transmitted to nodes NO1-NO9 via switching elements 80a-a to 80i-a. Connection switching circuit 7a connects I/O blocks 30a-d to I/O pads 6a-6d according to a connection control signal from connection control circuit 7b, and connects I/O blocks 30f-30i to I/O pads 60e-6h. Thus, I/O block 30e including the defective sub-block a is isolated when sub-block a is selected.

When sub-blocks b, c, or d is selected, the connection of connection switching circuit 7a is modified according to a connection control signal from connection control circuits 7c, 7d or 7e, according to respective sub-block designating signals $\phi$B, $\phi$C and $\phi$D. The selection of sub-block b, sub-block c, and sub-block d result in the isolation of I/O block 30b corresponding to bit I/O1, I/O block 30i corresponding to bit I/O8, and I/O block 30a corresponding to bit I/O4, respectively.

The I/O block to be isolated differs according to the selected sub-block. However, the I/O pads to be used are fixed to pads 6a-6h. Thus, the device can be used as a device of x8 organization. Because isolation of an I/O block can be carried out independently in unit of sub-blocks, the repairing rate and manufacturing yield are further improved to further reduce the production cost.

Embodiment 3

If the data bits include 16 bits, 2 bits of parity bits are provided. This is because there is a 8-bit data (word data). In other words, a parity bit of 1 bit is added to a data of 8 bits.

Figure 8:
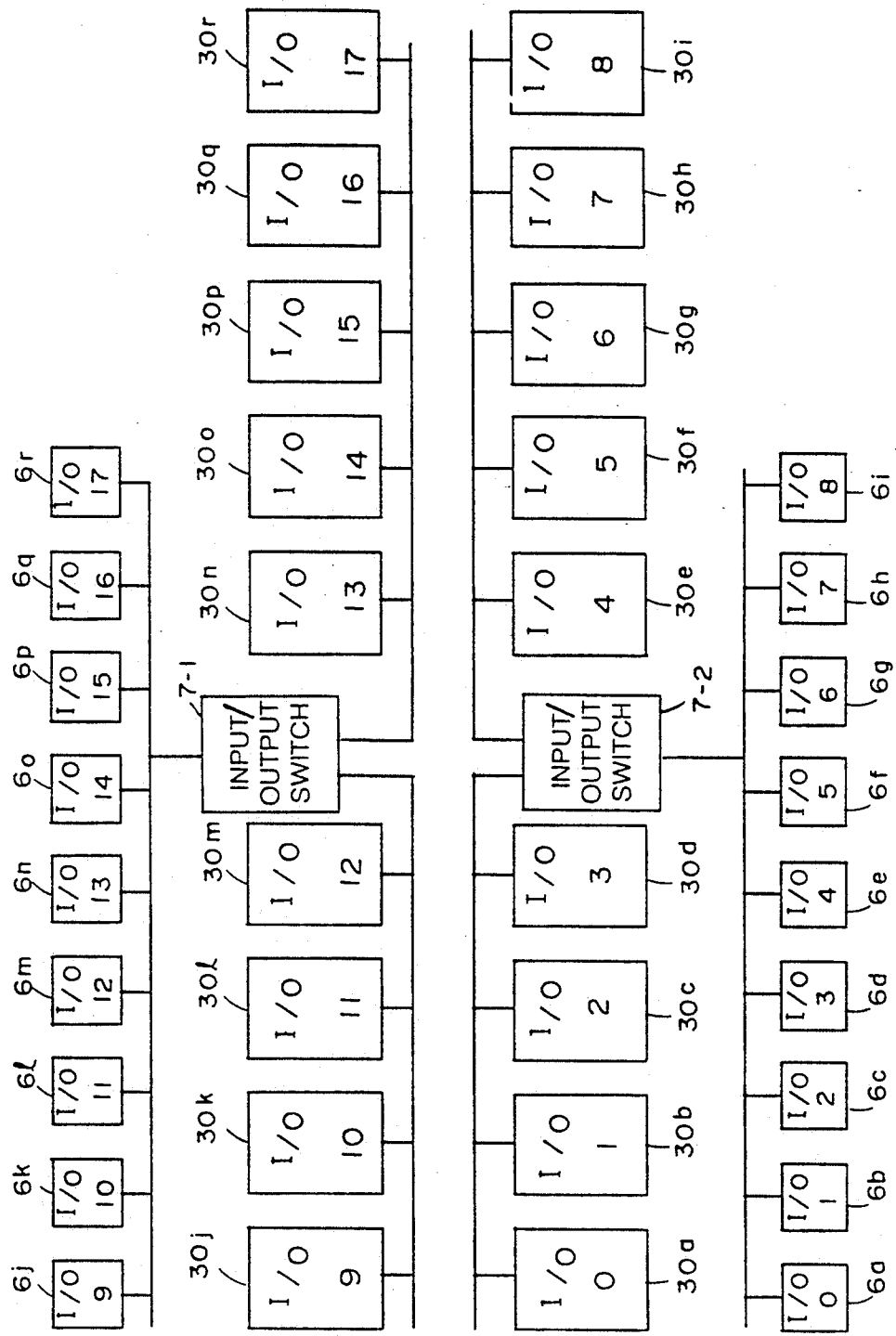
FIG. 8 shows an entire structure of a semiconductor memory device where the input/output switching circuit of FIG. 1 is applied to a device of a x18 bit organization.

FIG. 8 shows the arrangement of a semiconductor memory device having 2 bits of parity bits. 18 I/O blocks 30a-30r are provided. I/O pads 6a-6i for information bits I/O0-I/O8 are disposed at one side along the outer periphery of the device (chip), and pads 6j-6r are provided for information bits I/O9-I/O17 at the other side.

The position of I/O pin terminals are determined in advance in a semiconductor memory device. In a semiconductor memory device of a x16 bit organization, eight I/O pin terminals of the package are disposed on each side. When the structure of the input/output switching circuit of FIG. 1 is employed and connection of the eighteen I/O blocks are modified according to the presence of a defective I/O block, all the pads 6a-6i at one side are used, and pads 6j-6p of the other side are used. Pads 6g and 6r for bits I/O16 and I/O17 are not used. When a pad and an external lead terminal are to be connected at the time of packaging in such circumstances, a pad provided at one side must be wired to a lead terminal located at the other side, resulting in crossing of the bonding wires.

The distance between any pad and any lead frame (or a lead terminal) should be preferably the same from the standpoint of the balance of the input/output capacitance. If such a bonding wire extends from one to the other side, the input/output capacitance will be increased to degrade the reliability and high speed operation of the semiconductor memory device.

Thus, as shown in FIG. 8, an input/output switching circuit 7-1 is provided for I/O pads 6a-6i at one side, and an input/output switching circuit 7-2 is provided for I/O pads 6j-6r at the other side. In repairing, input/output switching circuit 7-1 selectively connects eight I/O blocks from I/O blocks 30a-30i to I/O pads 6a-6h. Input/output switching circuit 7-2 selectively connects 8 I/O blocks from I/O blocks 30j-30r to the eight I/O pads 6j-6q in repairing.

According to the structure shown in FIG. 8, input/output switching circuits 7-1 and 7-2 carry out the switching operation independently. Input/output switching circuits 7-1 and 7-2 can repair one I/O block respectively. When I/O blocks 30a and 30b corresponding to bits I/O0 and I/O1 are both defective, input/output switching circuit 7-1 cannot isolate both the two I/O blocks 30a and 30b. Therefore, if pads are disposed along the outer periphery of the chip as shown in the semiconductor memory device of FIG. 8, there may be a case where a device of a x18 bit organization cannot be used as a device of a x16 bit organization.

Figure 9:
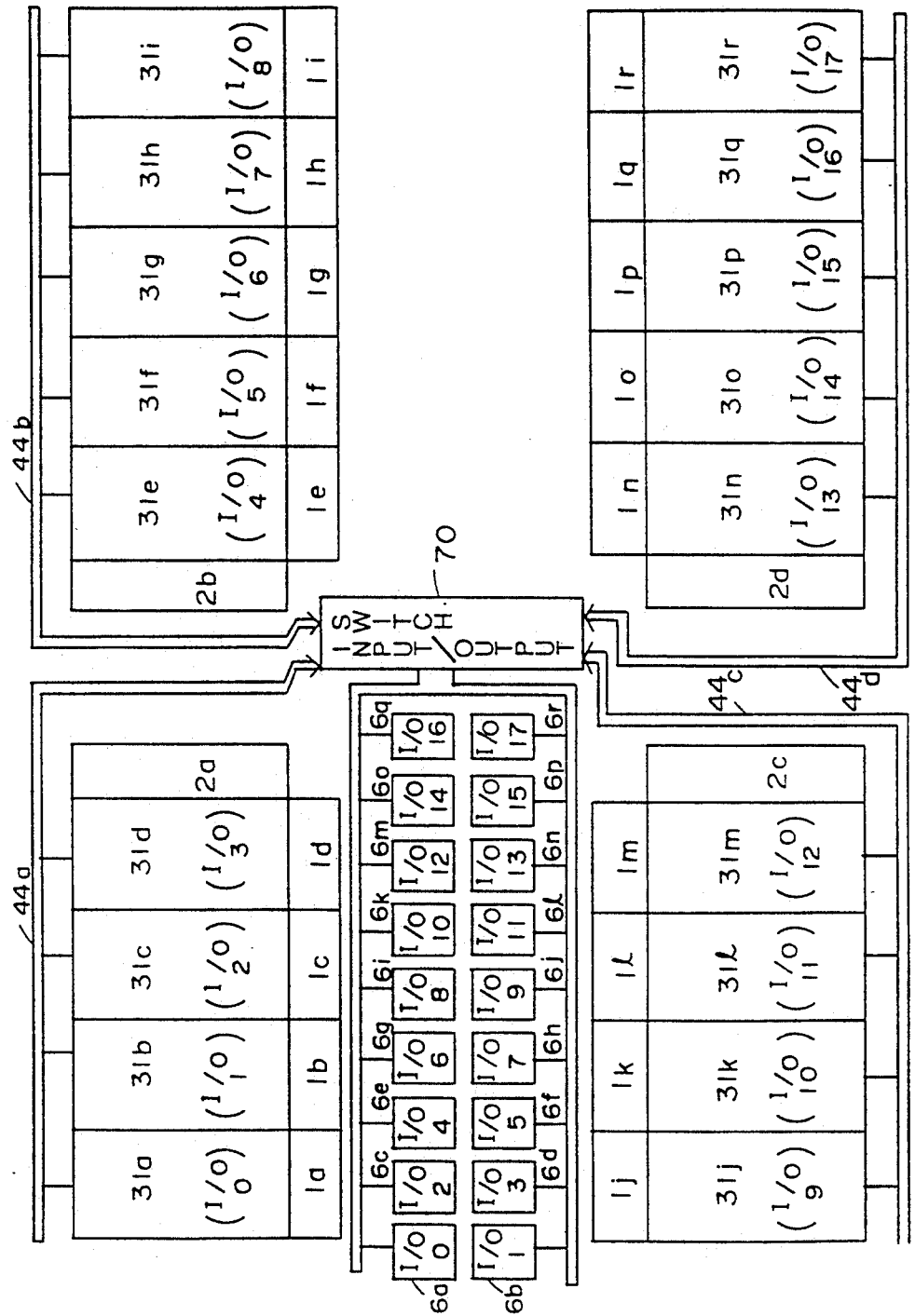
FIG. 9 shows an entire structure of a semiconductor memory device according to a third embodiment of the present invention.

FIG. 9 shows an entire structure of a semiconductor memory device according to a third embodiment of the present invention. The semiconductor memory device of FIG. 9 can repair arbitrary 16 I/O blocks from the 18 I/O blocks. The memory cell array is divided into 18 array blocks 31a-31r. Row decoders 1a-1r are provided in each of array blocks 31a-31r. A column decoder 2a is provided for array blocks 31a-31d, and a column decoder 2b is provided for array blocks 31e-31i. A column decoder 2c is provided for array blocks 31j-31m, and a column decoder 2d is provided for array blocks 31n-31r. Each of array blocks 31a-31r include a spare row and a spare column. Row decoders 1a-1r include a spare row decoder, and column decoders 2a-2d include a spare column decoder. The input/output portion of each of array blocks 31a-31d is connected to input/output switching circuit 70 via a data bus 44a, and the input/output portion of each of array blocks 31-31i is connected to input/output switching circuit 70 via a data bus 44b. The input/output portion of each of array blocks 31j-31m is connected to input/output switching circuit 70 via a data bus 44c, and the input/output portion of each of array blocks 31n-31r is connected to input/output switching circuit 70 via a data bus 44d.

I/O pads 6a-6r for the input and output of information bits are provided at the center portion of the semiconductor memory device. FIG. 9 shows the case where I/O pads 6a-6r are disposed between array blocks 31a-31d and array blocks 31j-31m. Pads for even numbered bits I/O0, ..., I/O 2x, ..., I/O 16 are disposed in one row, and I/O pads for odd numbered bits I/O1, ..., I/O 2x+1, ..., I/O17 are disposed in one row.

Input/output switching circuit 70 has a structure similar to that of input/output switching circuit 7 shown in FIG. 2. The number of fusable elements required for repairing 1 bit is 18 corresponding to the number of the I/O blocks. Input/output switching circuit 70 selects arbitrary 16 I/O blocks from the eighteen I/O blocks for connection with the sixteen I/O pads. The 16 I/O pads selected at the time of repair are fixedly predetermined.

According to the structure shown in FIG. 9, the flexibility of the interconnection of bonding wires at the time of packaging is greatly enhanced even if the position of the pin terminals for I/O (for information bits) of the external pin terminals is fixed. Therefore, desired pads can readily be connected to the 8 I/O lead terminals provided at one side and the 8 lead terminals provided at the other side, resulting in significant improvement in the repairing efficiency. In this case, a package having a structure called "lead on chip (LOC)", for example, may be used. When using a package of LOC structure, the I/O pads may be disposed only at one side of the outer periphery of the chip. A structure of a switching circuit for isolating two I/O blocks will be described hereinafter.

Figure 10:
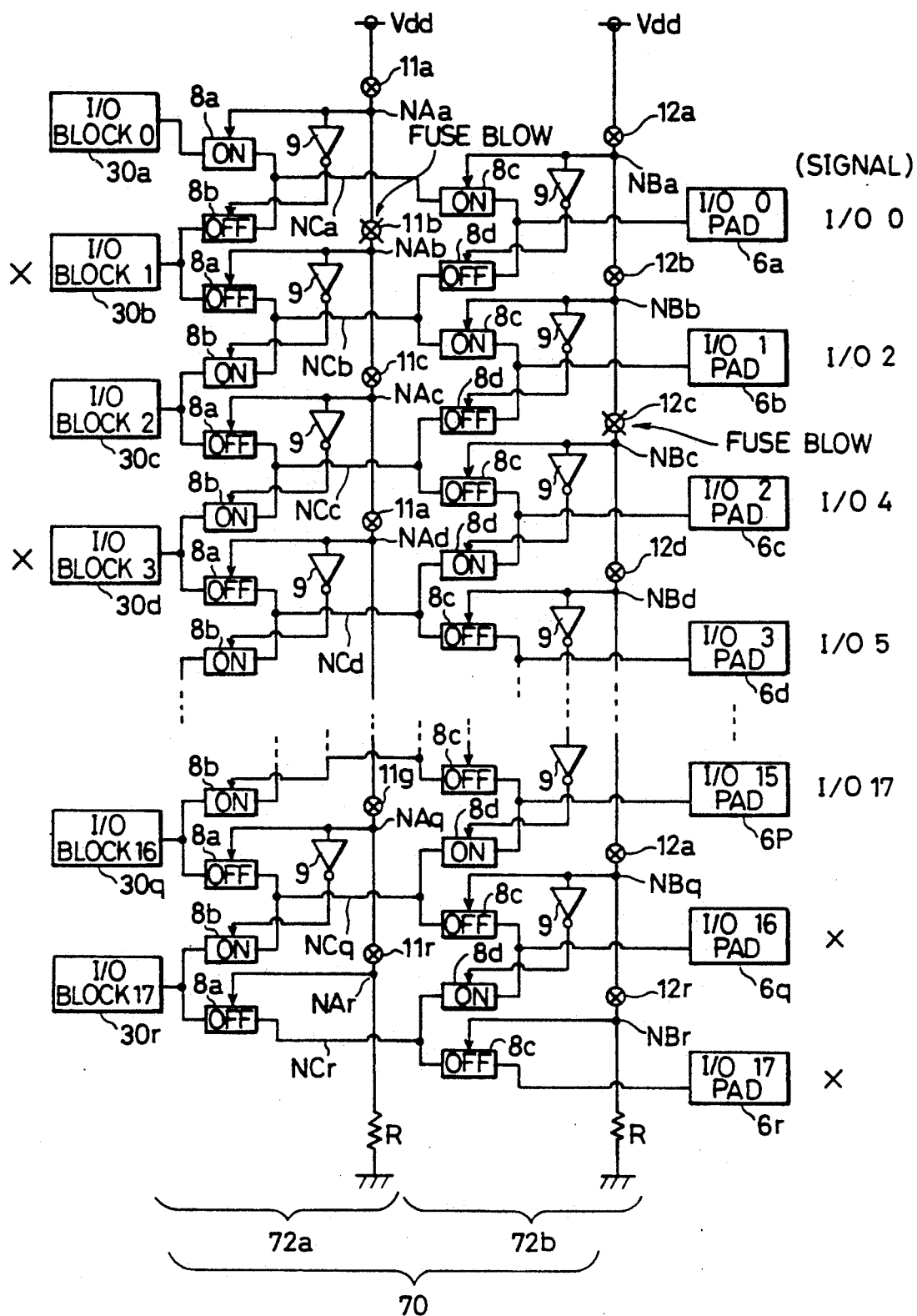
FIG. 10 specifically shows a structure of the input-/output switching circuit of FIG. 9.

FIG. 10 specifically shows a structure of the input/output switching circuit 70 shown in FIG. 9. Referring to FIG. 10, input/output switching circuit 70 includes switching circuits 72a and 72b which are cascaded in two stages.

Switching circuit 72a includes fusable elements 11a-11r connected in series between power supply potential Vdd and ground potential Vss, and a resistor R having a sufficiently great resistance value. Fusable elements 11a-11r correspond to I/O blocks 30a-30r, respectively. Switching circuit 72a further includes first switching elements 8a provided corresponding to each of I/O blocks 30a-30r and second switching elements 8b provided corresponding to I/O blocks 30b-30r. The potential of one end of a corresponding fusable element, i.e. of nodes NAa-Nar is supplied to the control input of a corresponding first switching element 8a. The potential of the other end of the corresponding fusable element, i.e. of nodes NAa-NAq is supplied to a corresponding second switching element 8b via an inverter circuit 9. First and second switching elements 8a and 8b in a pair become conductive complementarily.

Switching circuit 72b includes fusable elements 12a-12r connected in series between power supply potential Vdd and ground potential Vss, and resistive element R having a sufficiently large resistance value. Fusable elements 12a-12r correspond to I/O blocks 30a-30r, respectively. Switching circuit 72b further includes third switching elements 8c connected to input/output nodes NCa-NCr of first switching circuit 72a, and fourth switching elements 8d connected to input/output nodes NCb-NCr. The potential of one end of the corresponding fusable element i.e., of nodes NBa-NBr is transmitted to the control input of the associated third switching element 8c. The potential of the other end of the corresponding fusable element is transmitted to the control input of the associated fourth switching element 8d via inverter circuit 9.

First switching elements 8a connect I/O blocks to respective corresponding input/output nodes NCa-NCr. Second switching elements 8b connect I/O blocks 30a-30r to respective adjacent input/output nodes NCa-NCq. Third switching elements 8c connect input/output nodes NCa-NCr to corresponding I/O pads 6a-6r. Fourth switching elements 8d connect input/output nodes NCa-NCr of switching element 72a to respective adjacent I/O pads. Next the operation thereof will be described.

Consider the case where I/O blocks 30b and 30d corresponding to bits I/O1 and I/O3 are defective. Fusable element 11b corresponding to bit I/O1 is disconnected in first switching circuit 72a, whereby the potential of node NAa attain a "H" level. The potential of nodes NAb-NAr all attain a "L" level. Thus, I/O block 30b has first and second switching elements 8b and 8a both turned off to be isolated. Input/output nodes NCb-NCq of first switching circuit 72a are connected to I/O blocks 30c-30r corresponding to bits I/O2-I/O17 via second switching elements 8b.

Then, in the second switching circuit 72b, isolation of I/O block 30d corresponding to bit I/O3 is carried out. More specifically, fusable element 12c corresponding to input/output node NCc to which bit I/O3 is transmitted is disconnected. As a result, the potentials of nodes NBa and NBb attain a "H" level, and the potentials of the remaining nodes NBc-NBr attain a "L" level. Switching elements 8d and 8c corresponding to input/output node NCc are both turned off, whereby isolation of I/O block 30d connected to input/output node NCc of first switching circuit 72a is realized by second switching circuit 72b. As a result, input/output nodes NCd-NCr of first switching circuit 72a are connected to I/O pads 6c-6p. Input/output node NCr of first switching circuit 72a is connected to I/O pad 6q corresponding to bit I/O16 via switching element 8d. Node NCr is isolated from I/O block 30r by the corresponding switching element 8a. Therefore, no I/O block is connected to I/O pads 6q and 6r corresponding to bits I/O16 and I/O17.

According to the above-described structure, two arbitrary defective I/O blocks are isolated, and I/O blocks that operate properly are connected to the 16 I/O pads 6a–6p corresponding to bits I/O0–I/O15. Thus, a device of a x18 organization can be operated as a device of x16 organization.

A general description of the disconnection operation of fusable elements 11a–11r and 12a–12r is provided hereinafter. Isolation of an I/O block of a smaller number in the bit order is firstly performed in first switching circuit 72a. In this case, disconnection of a fusable element corresponding to this I/O block is carried out. Then, isolation of an I/O block having a larger number in the bit order is carried out by second switching circuit 72b. In the second switching circuit 72b, disconnection of a fusable element corresponding to an adjacent I/O block of a smaller number by one bit in the bit order with respect to the I/O block to be isolated is carried out. This is because the connection between an I/O block and a node is shifted by one in the input/output nodes of first switching circuit 72a.

Thus, according to the above described method, isolation of two I/O blocks can be readily carried out arbitrarily.

Embodiment 4

Figure 11:
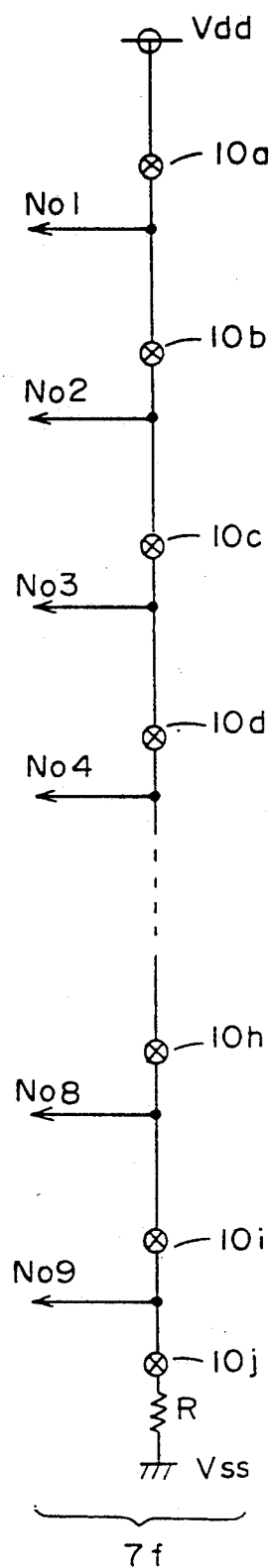
FIG. 11 shows a structure of an input/output switching circuit according to a fourth embodiment of the present invention.

FIG. 11 shows a structure of the main part of a semiconductor memory device according to a fourth embodiment of the present invention. In FIG. 11, a structure of a fuse circuit, i.e. a fusable element portion in an input/output switching circuit for a semiconductor memory device of x9 bit organization is shown. Referring to FIG. 11, a plurality of fusable elements 10a–10j and a resistor R having a sufficiently large resistance value are connected in series between power supply potential Vdd and ground potential Vss in FIG. 11. Respective one nodes of fusable elements 10a–10i are connected to nodes NO1–NO9, respectively. Nodes NO1–NO9 correspond to those shown in FIG. 3.

In the above-described embodiments of 1–3, the fuse circuit portion has series-connected fusable elements connected to ground potential via a resistive element R having a sufficiently large resistance value. The disconnection of a fusable element is carried out only when a defective I/O block is to be isolated. In operation as a semiconductor memory device with a parity bit, disconnection of a fusable element is not carried out. Therefore, a small through-current flows from power supply potential Vdd towards ground potential Vss via resistive element R. Although such a through current is small, it is not desirable from the standpoint of low power consumption.

In the structure of a fuse circuit 7f shown in FIG. 11, a fusable element 10j is provided between fusable element 10i and resistive element R. At the time of disconnection of a defective I/O block, one of fusable elements 10a–10i is disconnected. In operation as a semiconductor memory device with a parity bit i.e. in x9 organization, the extra fusable element 10j is disconnected. Thus, even when the device operates as a semiconductor memory device with a parity bit, the current path between power supply potential Vdd and ground potential Vss is cut off to eliminate a through current. It is therefore possible to reduce current consumption and power consumption.

Embodiment 5

Figure 12:
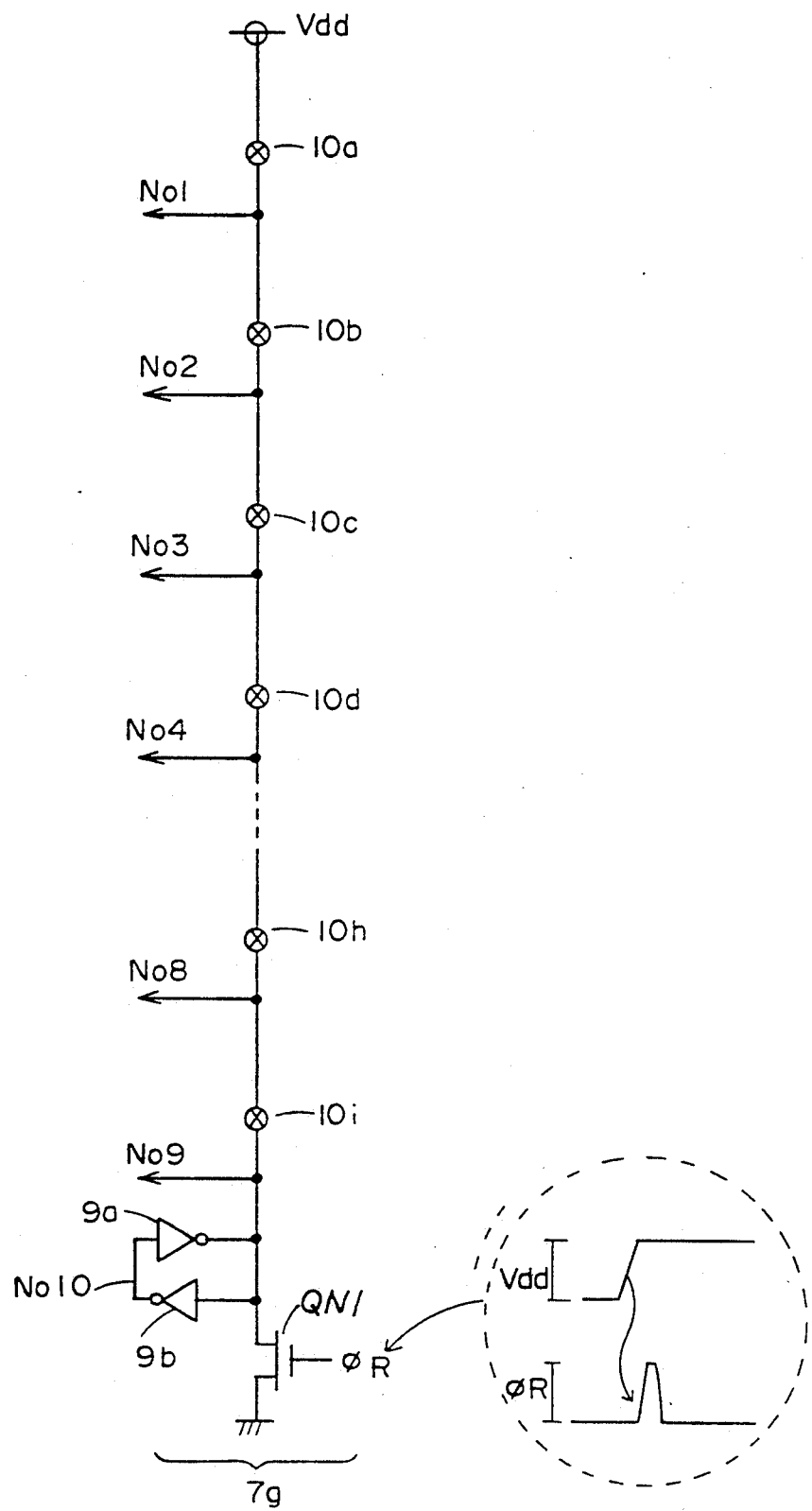
FIG. 12 shows another structure of the fuse circuit of FIG. 11.

FIG. 12 shows another structure of a fuse circuit. Fuse circuit 7g includes inverter circuits 9a and 9b for latching the potential of node NO9 instead of resistive element R, and an n channel MOS (insulated gate type) transistor QN1 provided between node NO9 and ground potential Vss. A power on detection signal $\phi R$ is supplied to the gate of transistor QN1. Power on detection signal $\phi R$ is a pulse signal generated for a predetermined time period when power supply voltage Vdd reaches a predetermined level at the time of applying power supply voltage Vdd. A semiconductor memory device is generally provided with a circuit for generating a power-on reset signal for resetting internal circuitry to an initialized state at the time of turning on the power supply in a semiconductor memory device. Reset signal $\phi R$ is equivalent to such a power-on reset signal. A power-on reset signal is generated by an inverter circuit of a plurality of stages for amplifying the charging potential of a capacitor charged via a resistor. The operation thereof will be described hereinafter.

Latch reset signal $\phi R$ attains a "H" level for a predetermined time when the power supply voltage Vdd attains a predetermined potential level after it is applied. When fusable elements 10a–10i are all conductive, nodes NO1–NO9 temporarily attain the potential level of "L". When latch reset signal $\phi R$ is brought to a "L" level, transistor QN1 is turned off and nodes NO1–NO9 attain a "H" level by power supply potential Vdd. In operation, latch reset signal $\phi R$ maintains a "L" level, whereby transistor QN1 maintains a turned off state. Therefore, no path for current flow exists in fuse circuit 7g to prevent the generation of a through current.

The state where one of fusable elements 10a–10i is disconnected will be described hereinafter. When latch reset signal $\phi R$ attains a "H" level, the potentials of the nodes residing near ground potential Vss with respect to the disconnected fuse are set to a "L" level. The potential of this "L" is fixed by the latch circuit of inverter circuits 9a and 9b. The nodes at the side of power supply potential Vdd with respect to the disconnected fuse attain a "H" level in accordance with the rise of power supply potential Vdd. Even when latch reset signal $\phi R$ is brought to a "L" level and transistor QN1 is turned off, a node that should be at the "L" level is maintained stably at the level of "L" by the "L" potential latched by inverter circuits 9a and 9b. The node that should attain the "H" level is set to "H" by power supply potential Vdd.

There is no current path from power supply potential Vdd towards ground potential Vss in the structure of FIG. 12, regardless of the disconnection of a fusable element.

In the structure of FIG. 12, an n channel MOS transistor is used to perform the reset of the latch circuit formed of inverter circuits 9a and 9b. A p channel MOS transistor may be used instead, and signal/$\phi R$ which is an inverted signal of latch reset signal $\phi R$ may be applied to the gate electrode of a p channel MOS transistor.

Fuse circuits 7b–7f have resistive element R connected to the ground potential level. The resistive element R may be connected to power supply potential Vdd, wherein the operation control of the ON/OFF of each switching element 8 is reversedly executed to be turned on upon receipt of a "L" level and turned off upon receipt of "H". At this time, the additional fusable element, or the latch circuit and reset transistor shown in FIGS. 11 and 12 may be provided at the power supply voltage side to obtain similar effects.

Embodiment 6

Figure 13A:
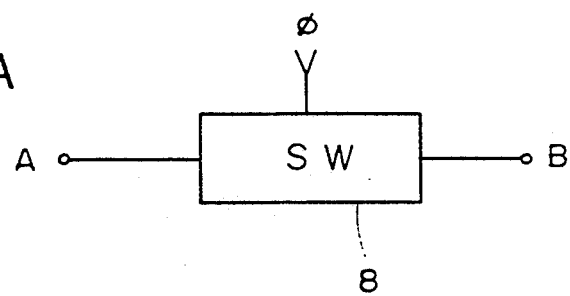
FIGS. 13(a)–(c) specifically show a structure of a switching element used in an input/output switching circuit.

A specific structure of switching element 8 will be described now. FIG. 13A is a symbolic representation of switching element 8. Switching element 8 has its control input connected to a fusable element. In FIG. 13A, a control signal provided from this fusable element is indicated by a symbol of $\phi$. Node A is the signal (information) input/output node of an I/O block, and node B is connected to an I/O pad or to a switching element of the switching circuit of the next stage.

In the foregoing, the switching element is described as transmitting a signal bidirectionally. Therefore, the switching element has a bidirectional transfer function.

Figure 13B:
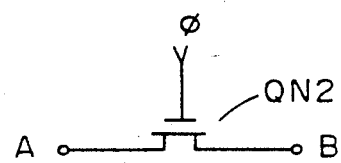

FIG. 13B shows an example of a specific structure of switching element 8. Switching element 8 is implemented using an n channel MOS transistor QN2 that conducts in response to a control signal $\phi$.

Figure 13C:
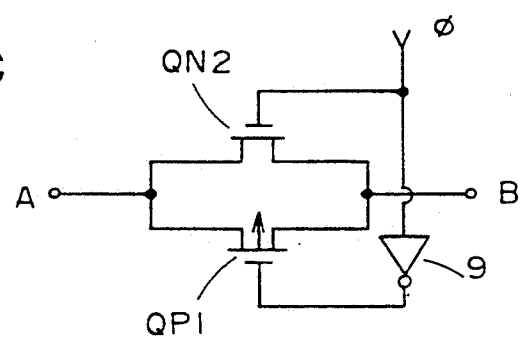

FIG. 13C shows another structure of a switching element. The switching element 8 shown in FIG. 13C includes an n channel MOS transistor QN2 and a p channel MOS transistor QP1 provided in parallel between nodes A and B. Control signal $\phi$ is supplied to the gate of n channel MOS transistor QN2. Control signal $/\phi$ is supplied to the gate of p channel MOS transistor via inverter circuit 9. The switching elements shown in FIGS. 13B and 13C are provided between an input/output node, i.e. the input/output circuit of a corresponding I/O block and a pad.

In the actual structure of a semiconductor memory device, the input/output circuit includes an input buffer circuit that buffers an input signal for transmission to an I/O block, and an output buffer circuit for amplifying information provided from a corresponding I/O block. An input/output switching circuit can be provided in such an input/output circuit.

Embodiment 7

Figure 14:
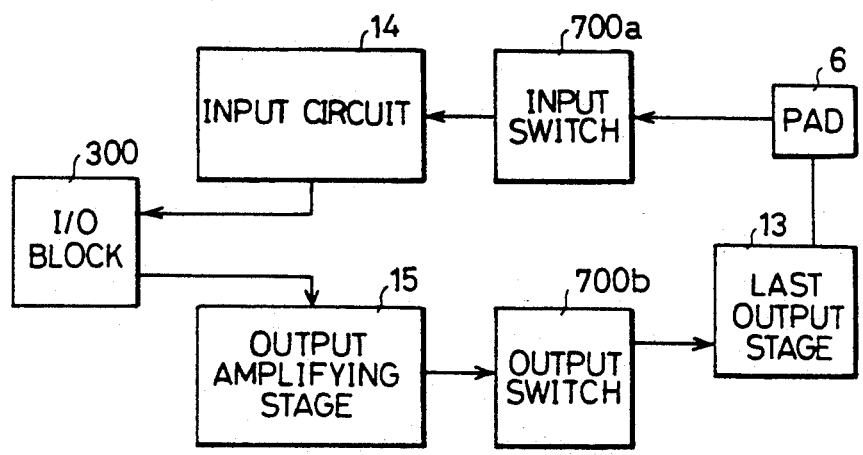
FIG. 14 shows a structure of a semiconductor memory device according to a seventh embodiment of the present invention.

FIG. 14 schematically shows a structure of a semiconductor memory device according to a seventh embodiment of the present invention. FIG. 14 shows only the portion in association with one I/O block and one pad. An input/output switching circuit 700a is provided between a pad 6 and an input circuit 14 that buffers a supplied signal for transmission to a corresponding I/O block 300 (or for generating an internal write data). An output switching circuit 700b is provided between an output amplifying stage 15 for amplifying information read out from I/O block 300 and a last output stage 13 for driving pad 6 in response to an output of output amplifying stage 15. Input circuit 14, last output state 13, output amplifying stage 15, and I/O block 300 correspond to the I/O block 30 described in the preceding embodiments. Input circuit 14, output amplifying stage 15 and last output stage 13 implement an input/output circuit in a general semiconductor memory device.

The input path of an information signal differs from the output path. More specifically, an information bit to be written into I/O block 300 is transmitted from pad 6 via an input circuit 14. Information read out from I/O block 300 is transmitted to pad 6 via output amplifying stage 15 and last output stage 13. In the structure shown in FIG. 14, switching circuits are respectively provided in the input signal transmitting path and the output signal transmitting path. Input switching circuit 700a and output switching circuit 700b each include independent switching elements. Input switching circuit 700a and output switching circuit 700b have a structure including a switching element and a fusable element similar to those described above. The switching element has its ON/OFF controlled by the connection/disconnection of a fusable element. The fusable element may be shared by input switching circuit 700a and output switching circuit 700b.

The provision of separate switching circuits in a signal input path and a signal output path as those shown in FIG. 14 is advantageous from the standpoint of high speed operation because it is not necessary to consider the impedance of a switching element. More specifically, even if impedance exists in the switching elements in input switching circuit 700a and output switching circuit 700b, input/output of information is carried out at a high speed by input circuit 14 having buffering capability and last output stage 13 that drives a pad. If a switching circuit 7 is disposed between last output stage 13 and pad 6, data read out may not be carried out at a high speed because signal transmission to pad 6 is delayed by the effect of impedance of switching circuit 7. By providing an output switching circuit between output amplifying stage 15 and last output stage 13, an amplified signal from output amplifying stage 15 is transmitted to the input of the switching element of the output switching circuit, and last output stage 13 amplifies this signal to drive pad 6 at a great driving capability, so that read out of data can be carried out at high speed.

In the present embodiment, a switching circuit is provided between an I/O block and a pad. This is to prevent the disadvantage of degradation in the speed of transmission of data information due to the influence of impedance of the switching circuit provided between an input/output circuit and a memory cell array portion.

In the structure of FIG. 14, the direction of signal transfer can be unidirectionally established for input switching circuit 700a and output switching circuit 700b. In this case, a switching element such as that shown in FIG. 15 can be employed.

Figure 15:
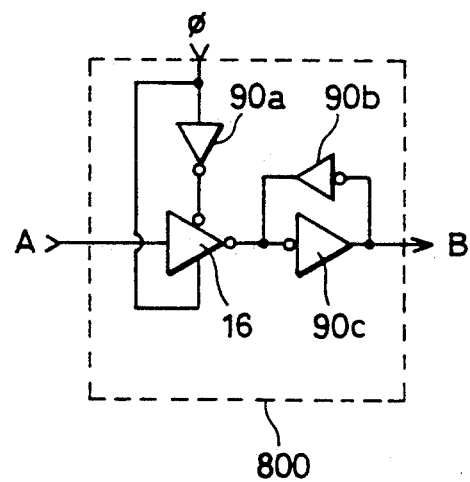
FIG. 15 specifically shows a structure of a switching element used in the input switching circuit and the output switching circuit of FIG. 14.
Figure 16:
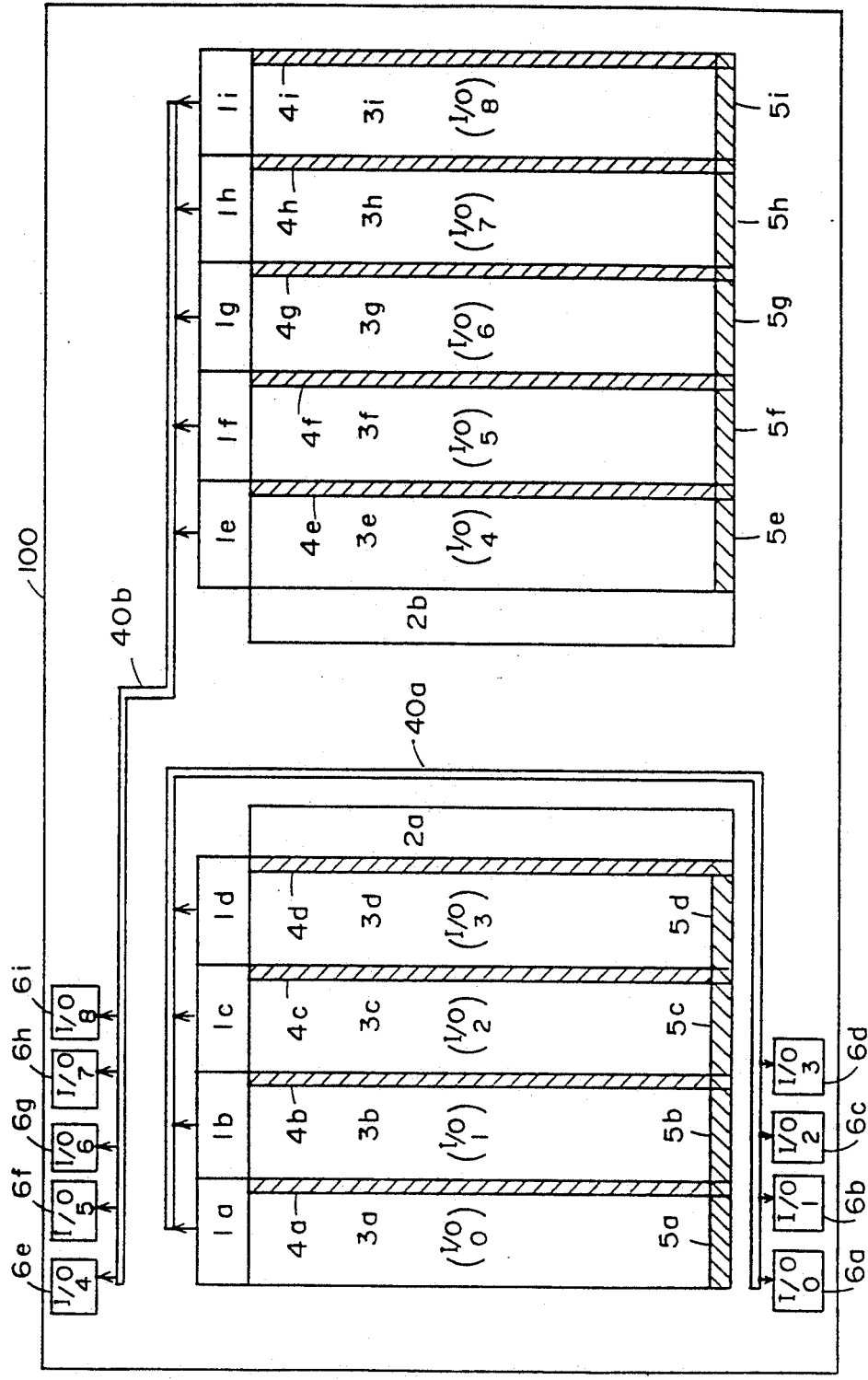
FIG. 16 shows a structure of a conventional semiconductor memory device with a parity bit.
Figure 17:
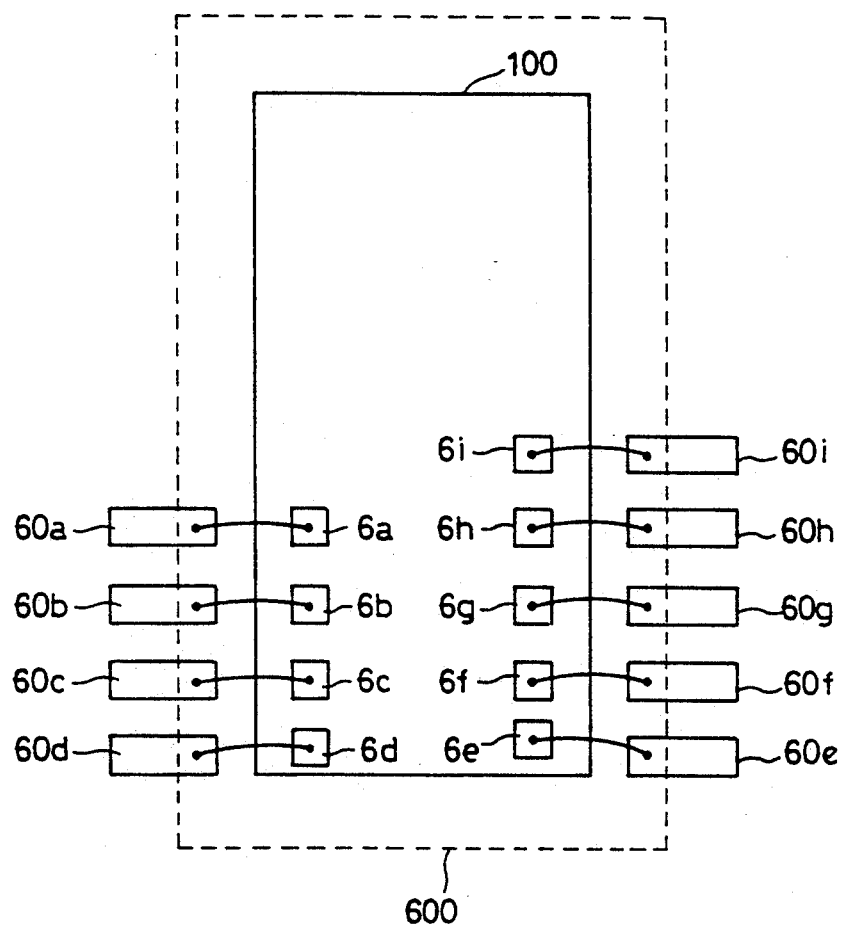
FIG. 17 shows the connection between a pad in a conventional semiconductor memory device and an external terminal.

Referring to FIG. 15, a switching element 800 includes a clocked inverter circuit 16 for amplifying and inverting a signal supplied to node A, an inverter circuit 90c for amplifying and inverting an output of inverter circuit 16, and an inverter circuit 90b for amplifying and inverting the potential of node B for transmission to the input of inverter circuit 90c. A control signal $\phi$ is supplied to the control input of clocked inverter circuit 16 via inverter circuit 90a. Control signal $\phi$ is generated from an associated fusable element. Inverter circuits 90b and 90c form a latch circuit. Clocked inverter circuit 16 operates when control signal $\phi$ attains a "H" level, and attains a high impedance output state when control signal $\phi$ is at "L" level. The switching element 800 shown in FIG. 15 has a unidirectional signal transfer from node A to node B, and this structure itself has a buffering function. Therefore, the switching rate can be increased in comparison with the bidirectional transfer type switching element as shown in FIGS. 13B and 13C, resulting in high speed transmission of an information signal. This is advantageous from the standpoint of increasing the operation speed of a semiconductor memory device.

Although the embodiments have been described as to a semiconductor memory device with a parity bit of ×9 organization and x18 organization, the bit width of the input/output of this semiconductor memory device may be a larger one such as x36. Only a feature of provision of an error checking bit area is required.

Although a parity bit is described as an error checking bit in the above embodiments, the present invention is not limited to this parity checking method, and other error checking methods may be used as long as a region for storing an error checking bit is provided in a semiconductor memory device. The input/output switching circuit of the present embodiment is used in combination with the repair of a defective memory cell in an I/O block by a redundant circuit (spare row and column) in a memory cell array block of a redundant structure as described already.

According to the present invention, a defective I/O block is isolated from a pad when a defective I/O block (memory cell array block) exists, and connection between an I/O block and a pad is implemented such that always the same I/O pads are used. Therefore, a semiconductor memory device with an error checking bit can be used as a semiconductor memory device without an error checking bit, resulting in significant improvement in yield.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a plurality of pads for receiving and transmitting information bit signals, arranged in a predetermined sequence of information bit signals;
   a plurality of IO blocks provided corresponding to said plurality of pads for transferring information bit signals to and from said plurality of pads, each said IO blocks including a plurality of memory cells arranged in rows and columns;
   connection means provided between said IO blocks and said pads for establishing signal transfer paths between said pads and said IO blocks for isolating a defective IO block containing a defective memory cell from any of said pads, and changing a connection path between an IO block residing on one side with respect to said defective IO block in the predetermined sequence so as to become directed toward a pad to which said defective IO block should be connected, and thereby connecting IO blocks other than the defective IO block to particular pads of predetermined positions among said pads.

2. A semiconductor memory device according to claim 1, wherein said connection means includes:
   first establishing means provided for a first IO block for connecting the first IO block to a first pad placed on one end of said pads in the predetermined sequence;
   second establishing means provided for each IO block other than the first IO block for selectively and alternatively connecting an associated IO block to one of successively adjacent pads in the predetermined sequence; and
   defining means for defining connection paths of said first and second establishing means such that when a defective IO block exists, an IO block in a first group including IO blocks placed on the side of the first IO blocks in the predetermined sequence with respect to the defective IO block is connected to an originally corresponding pad, and an IO block in a second group of the remaining IO blocks is connected to an adjacent pad in the predetermined sequence by one from an originally corresponding pad in a direction to the first pad in the predetermined sequence.

3. A semiconductor memory device according to claim 1, wherein said connection means includes
   a first switching means including a first switching element provided for a first IO block for connecting the first IO block to a first pad positioned on one end of said pads in the predetermined sequence;
   a second switching means including a pair of first and second switching elements, complementarily turning on and off with each other and provided for each IO block other than the first IO block, for selectively connecting an associated IO block to one of two adjacent pads in the predetermined sequence;
   and defining means including a plurality of fusable elements connected in series between a first node receiving a first level voltage and a second node for receiving a second level voltage if a fusable element is fused off, said fusable elements provided corresponding to each respective IO block, and each said fusable element having one end connected to a control gate of a first switching element for a corresponding IO block, and to a control gate of a second switching element for an adjacent IO block in a reverse sequence of the predetermined sequence through an inverter.

4. A semiconductor memory device according to claim 3, wherein said defining means includes a resistive element of a large resistance value provided between the second node and a node supplying the second level voltage.

5. A semiconductor memory device according to claim 3, wherein said defining means includes an additional fusable element having one end connected to said second node, and a resistive element of a large resistance value provided between another end of the additional fusable element and a node receiving the second level voltage.

6. A semiconductor memory device according to claim 3, wherein said defining means includes coupling means responsive to a power on detecting signal for connecting the second node to a node receiving the second level voltage, and latch means for latching a potential on said second node.

7. A semiconductor memory device according to claim 1, wherein each said IO block includes a plurality of sub-memory blocks, and wherein said connection means includes
   sub-block selection means responsive to a block address for generating a sub-block designating signal,
   connection switching means for connecting said pads and said IO blocks,
   connection control means provided for each said sub-block and responsive to the sub-block designating signal for generating and transmitting a connection control signal corresponding to the designated sub-block to the connection switching means to establish the connection path through the connection switching means between the IO blocks and said pads.

8. A semiconductor memory device according to claim 7, wherein said connection control means includes a plurality of connection control signal generating means provided for each said sub-blocks and each for generating a connecting control signal for an associated sub-block, and transfer means responsive to the sub-block designating signal for selecting and transferring a connection control means from a connection control signal generating means corresponding to a sub-block designated by said sub-block designating signal to said connection switching means.

9. A semiconductor memory device according to claim 10, wherein said transferring means includes a plurality of switching means provided for each connection control signal generating means and each activated in response to the block designating signal to turn on to transfer a connection control signal from an associated connection control signal generating signal to said connection switching means.

10. A semiconductor memory device according to claim 3, wherein each said IO block includes a plurality of sub-blocks each including a plurality of memory cells arranged in a matrix, and wherein said defining means is provided corresponding to each said sub-block, and connecting means further includes sub-block selection means responsive to a block address for generating a sub-block designating signal, and, transfer means provided for each said defining means and responsive to the sub-block designating signal to turn on to transfer a signal potential on one end of the fusable element in an associated defining means to the control gates of each respective first and second switching elements of said first and second switching means.

11. A semiconductor memory device according to claim 1, wherein said connection means includes a first connection control means for selectively connecting said IO blocks and a plurality of internal nodes, and a second connection control means for selectively connecting the plurality of first nodes to said pads.

12. A semiconductor memory device according to claim 11, wherein said first connection control means includes a first switching means including a first switching element for connecting a first IO block to a first node, second switching means including a pair of first and second switching elements complementarily turning on and off with each other and provided for each IO block other than the first IO block, for connecting an associated IO block to an associated node of said nodes, and first connection establishing means for establishing on and off of said first and second switching elements of said first and second switching means, such that when a first detective IO block is present, the first switching element for an IO block corresponding to a bit signal on the side of a first bit signal in said predetermined sequence with respect to said first defective IO block is made on, the first switching element for each of the remaining IO blocks is made off, and the first and second switching elements for the first defective IO blocks are both off, and, said second connection control means includes third switching means including a third switching element for coupling the first node to said first pad, first switching means provided for each node other than said first node and including third and fourth switching elements normally turning on and off complementarily with each other for coupling an associated node to one of two adjacent pads in said predetermined sequence, and second connection establishment means for establishing on and off of said third and fourth switching elements of said third and fourth switching means in such a manner that when an additional defective IO block is present, the third switching element for a node on the side of the first node with respect to a node associated with the additional defective IO block is turned on, the third element for each of the remaining nodes is turned off, and the switching element for the node associated with the additional defective IO block is turned off to isolate the additional defective IO block from any of the of the pads.

13. A semiconductor memory device according to claim 12, wherein said first connection establishment means includes a series connection of fusable elements corresponding to the IO blocks provided between a first voltage supply node and a second voltage supply node, and said second connection establishment means includes a series connection of another fusable elements corresponding to respective nodes provided between the first voltage supply node and the second voltage supply node.

14. A semiconductor memory device according to claim 1, wherein said plurality pads includes a first group of pads arranged on one side of said memory device, and a second group of pads arranged on another side opposed to said one side, and said IO blocks correspondingly includes a first group of IO blocks associated with the first group of pads, and a second group of IO blocks associated with the second group of pads, and said connection means includes a first connection means for coupling the first group of pads and the first group of IO blocks and second connection means for coupling the second group of pads and the second group IO blocks.

15. A semiconductor memory device according to claim 1, wherein said IO blocks includes a first group of IO blocks arranged along one side of said memory device, and a second group of IO blocks arranged along another side of said memory device, and said plurality of pads are placed in a section between said first group of IO blocks and said second group of IO blocks, and said connection means couples the IO blocks of said first and second groups to said pads.

16. A semiconductor memory device according to claim 1, wherein each of said IO blocks includes a memory cell array having a plurality of memory cells, an input circuit for transferring a data signal to said memory cell array, a first output circuit for amplifying a data signal from the memory cell array, and a second output circuit for supplying a data signal to an associated pad, and said connection means includes an input connection unit provided between said associated pad and said input circuit, and an output connection unit provided between said first and second output circuits.

17. A semiconductor memory device according to claim 16, wherein said input and output units each include a transfer element for unidirectionally transferring a data signal.

18. A semiconductor memory device according to claim 17, wherein said transfer element includes a latch for latching a data signal, and a control element for inhibiting or allowing data transfer to said latch.

19. A semiconductor memory device according to claim 1, wherein said pads receive information data bit signals and an error checking bit signal in parallel, and said connection means includes means for isolating a pad specified to receive the error checking bit from any IO block when a defective IO block is present.

20. A semiconductor memory device that can store an error checking bit and a plurality of data bits, comprising:
- a plurality of pads for receiving in parallel said error checking bit and data bits,
- a plurality of memory cell array blocks provided corresponding to said plurality of pads, said plurality of memory cell array blocks including an array block for storing a data bit, and an array block for storing said error checking bit,
- means for generating an isolating indicating signal for isolating a defective memory cell array block when a defective memory cell array exists in said plurality of memory cell array blocks, and,
- connection means provided between said plurality of memory cell array blocks and said plurality of pads for electrically connecting each of said memory cell array blocks and a corresponding pad,
- wherein said connection means comprises connection changing means responsive to said isolation indicating signal for dividing memory cell array blocks excluding said defective memory cell array block into a first group including only a memory cell array block for storing a data bit and a second group including memory cell array blocks for storing the remaining data bits and a memory cell array block for storing an error checking bit, and regarding the connection between a memory cell array block of said second group and a pad, changing the connection destination of the memory cell array block of said second group so that the pad corresponding to said defective memory cell array block has one memory cell array block of said second group connected and said pad for an error checking bit is at a non-connected state with a memory cell array block, and electrically isolating said defective memory cell array block from all pads.

21. The semiconductor memory device according to claim 20, further comprising an input stage for buffering a signal applied to a pad to transmit the same to a corresponding memory cell array block, output signal amplifying means for amplifying a signal transmitted from a corresponding memory cell array block, and a last output stage responsive to an output of said output signal amplifying means for transmitting a signal to a corresponding pad,
wherein said connection means are provided between a corresponding pad and said input stage, and between said output signal amplifying means and said last output stage, respectively.

22. A semiconductor memory device that can store an error checking bit and a data bit, comprising:
- a plurality of pads for receiving in parallel said error checking bit and data bit, said error checking bit and data bit being arranged in a predetermined bit sequence in said parallel arrangement,
- a plurality of memory cell array blocks provided corresponding to said plurality of pads,
- connection manner defining means including a plurality of fusable elements connected in series between a first potential and a second potential, said plurality of fusable elements being provided corresponding to said plurality of memory cell array blocks,
- first connection means provided between said plurality of memory cell array blocks and said plurality of pads for connecting each of said memory cell array blocks to a corresponding pad when said fusable elements in said connection manner defining means are all conductive, and
- second connection means provided between said plurality of memory cell array blocks and said plurality of pads for isolating a memory cell array block corresponding to a non-conductive fusable element from all pads when one of said plurality of fusable elements is non-conductive, and shifting the connection destination of all the memory cell array blocks corresponding to pads located from the pad adjacent the pad corresponding to said isolated memory cell array block in bit sequence to the error bit pad, by one in the direction towards said isolated memory cell array block in said bit sequence.

23. The semiconductor memory device according to claim 22, further comprising:
- input means provided between each of said pads and each memory cell array block for buffering a signal transmitted from a corresponding pad to transmit the same to a corresponding memory cell array block,
- output signal amplifying means provided corresponding to each of said memory cell array blocks for amplifying a signal transmitted from a corresponding memory cell array block, and
- last output means responsive to a signal from said output signal amplifying means for transmitting an output signal to a corresponding pad,
- wherein said first and second connection means are both provided between said input means and a corresponding pad and between said output signal amplifying means and said last output means.

24. A semiconductor memory device that can store an error checking bit and data bit, comprising:
- a plurality of pads for receiving in parallel said error checking bit and said data bit, said error checking bit and said data bit being arranged in a predetermined bit sequence in said parallel arrangement,
- a plurality of memory cell array blocks provided corresponding to each of said plurality of pads,
- a plurality of fusable elements provided in series between first and second potentials, said plurality of fusable elements being provided corresponding to said plurality of memory cell array blocks,
- a plurality of first signal transfer means provided between each of said memory cell array blocks and each of said pads for attaining a conductive state in response to a potential of one end of a corresponding fusable element, said first signal transfer means providing a signal transfer path between a corresponding memory cell array block and a corresponding pad, and
- a plurality of second signal transfer means provided between each of said memory cell array blocks excluding the memory cell array block corresponding to the pad corresponding to a first bit and each of said pads, responsive to a potential of the other end of a corresponding fusable element for conducting in a complementary manner with said first signal transfer means, said second signal transfer means providing a signal transfer path between a corresponding memory cell array block and a pad adjacent in the direction of said first bit in a bit sequence with respect to the corresponding pad.

25. The semiconductor memory device according to claim 24, further comprising:
 input means provided corresponding to each said memory cell array blocks for buffering a received signal for transmission to a corresponding memory cell array block,
 output amplifying means provided corresponding to each of said memory cell array blocks for amplifying a signal transmitted from a corresponding memory cell array block, and
 last output means provided corresponding to each of said pads for transmitting a signal to a corresponding pad in response to a supplied signal,
 wherein said first and second signal transfer means are both provided between each of said pads and each said input means, and between each said output means and each said last output means.

26. A semiconductor memory device that can store an error checking bit and a data bit, comprising:
 a plurality of pads for receiving in parallel said error checking bit and said data bit,
 a plurality of memory cell array blocks provided corresponding to said plurality of pads, each of said memory cell array blocks including a plurality of sub-blocks, said plurality of sub-blocks having only one sub-block selected and activated in one memory cell array block at the time of operation,
 connection manner defining means provided corresponding to said plurality of sub-blocks and activated in response to a sub-block designating signal, for generating an isolation indicating signal to isolate a memory cell array block including a defective sub-block from said plurality of pads when a defective sub-block exists in any of said plurality of sub-blocks, and
 connection means provided between said plurality of memory cell array blocks and said plurality of pads for connecting each of said memory cell array blocks and each of said pads in a one-to-one correspondence,
 wherein said connection means comprises means for isolating a corresponding memory cell array block from said plurality of pads in response to said isolation indicating signal, and for shifting the connection destination of each memory cell array block corresponding to pads located from the pad adjacent in said bit sequence to the pad corresponding to said corresponding memory cell array block to said error checking bit pad by one in said bit sequence.

27. The semiconductor memory device according to claim 26, further comprising:
 input means provided corresponding to each of said memory cell array blocks for buffering a received signal for transmission to a corresponding memory cell array block,
 output amplifying means provided corresponding to each of said memory cell array blocks for amplifying a signal transmitted from a corresponding memory cell array block, and
 last output means provided corresponding to each of said pads for transmitting a signal to a corresponding pad in response to a received signal,
 wherein said connection means is provided between each of said pads and each said input means, and between each said output means and each said last output means.

* * * * *